United States Patent
Miura et al.

[11] Patent Number: 5,889,312
[45] Date of Patent: Mar. 30, 1999

[54] SEMICONDUCTOR DEVICE HAVING CIRCUIT ELEMENT IN STRESS GRADIENT REGION BY FILM FOR ISOLATION AND METHOD OF MANUFACTURING THE SAME

[75] Inventors: Hideo Miura, Koshigaya; Yasunobu Tanizaki; Eiji Wakimoto, both of Takasaki; Shinji Sakata, Katsuta; Makoto Ogasawara, Akishima; Hiroo Masuda, Tokyo; Jun Murata, Kunitachi; Noriaki Okamoto, Ibaraki-ken, all of Japan

[73] Assignee: Hitachi, Ltd., Tokyo, Japan

[21] Appl. No.: 890,997

[22] Filed: Jul. 10, 1997

Related U.S. Application Data

[63] Continuation of Ser. No. 309,423, Sep. 20, 1994, abandoned, which is a continuation-in-part of Ser. No. 270,472, Jul. 5, 1994, abandoned.

[30] Foreign Application Priority Data

| Jul. 2, 1993 | [JP] | Japan | 5-188673 |
| Sep. 20, 1993 | [JP] | Japan | 5-232898 |

[51] Int. Cl.$^6$ ............................. H01L 3/22; H01L 21/265
[52] U.S. Cl. ........................ 257/420; 257/536; 257/543
[58] Field of Search .................... 257/536, 543, 257/539, 540, 358, 420, 344

[56] References Cited

U.S. PATENT DOCUMENTS

| 3,965,453 | 6/1976 | Seidel et al. | 257/536 |
| 4,298,401 | 11/1981 | Nuez et al. | 257/543 |
| 5,065,132 | 11/1991 | Taddiken et al. | 257/536 |
| 5,262,664 | 11/1993 | Jung-Suk | 257/344 |
| 5,304,838 | 4/1994 | Ozawa | 257/536 |

FOREIGN PATENT DOCUMENTS

| 62-165353 | 7/1987 | Japan | 257/358 |
| 2-283037 | 11/1990 | Japan | 257/420 |
| 4-113666 | 4/1992 | Japan | 257/536 |
| 4-267554 | 9/1992 | Japan | 257/344 |

OTHER PUBLICATIONS

Sze, *Semiconductor Devices: Physics and Technology*, 1985, pp. 6–7.

Miura et al., "Residual Stress Measurement in Silicon Substrates after Thermal Oxidation," Series A, vol. 36, No. 3, Jul. 1993, pp. 302–308.

Stauley wolf, "Fully Recessed Oxide Locos Processes", *Silicon Processing for the VLSI Era*, vol. II, p. 28, 2.3.

*Primary Examiner*—Donald L. Monin, Jr.
*Attorney, Agent, or Firm*—Antonelli, Terry, Stout & Kraus, LLP

[57] ABSTRACT

A semiconductor device includes a thermal oxide film for isolation, a semiconductor region that becomes an element forming region with the circumference thereof surrounded by the oxide film and diffused resistance layers in the semiconductor region and provides a structure for controlling resistance value variation of diffused resistors originated in a stress generated at time of forming the oxide film for isolation. A distance between an end portion on a longer side closest to a thermal oxide film of the diffused layer and an end of the thermal oxide film is apart from each other by a predetermined value determined by stress distribution in the semiconductor region or by at least 4 $\mu$m or more, the longitudinal direction of the diffused layer portion formed from the end of the thermal oxide film over to a stress distribution (gradient) forming region in the semiconductor region is parallel to the forming direction of the stress gradient, and resistance value distribution is formed parallel to the stress gradient in the diffused layer formed from the end of the thermal oxide film over to the stress distribution forming region in the semiconductor region.

26 Claims, 16 Drawing Sheets

(TWO-INPUT) AND CIRCUIT

→ PMOS
← NMOS (TWO-INPUT) NOR CIRCUIT

INVERTER CIRCUIT

SEMICONDUCTOR DEVICE HAVING CIRCUIT ELEMENT IN STRESS GRADIENT REGION BY FILM FOR ISOLATION AND METHOD OF MANUFACTURING THE SAME

CROSS-REFERENCE TO RELATED APPLICATIONS

This application is a continuation of application Ser. No. 08/309,423, filed on Sep. 20, 1994, now abandoned, which is a continuation-in-part of application Ser. No. 08/270,472, filed Jul. 5, 1994, now abandoned.

BACKGROUND OF THE INVENTION

The present invention relates to semiconductor devices and methods of designing and manufacturing the same, and more particularly to device structures for setting a characteristic variation among a plurality of semiconductor devices based on stress distribution in a semiconductor element forming region originated in the existence of an oxide film forming an isolation region to a predetermined value or below in a highly integrated semiconductor device and a method of manufacturing the same.

In forming a conventional semiconductor device, a thermal oxide film of silicon ($SiO_2$) has been used for the purpose of aiming at electrical insulation between adjacent devices. Since there is a difference in coefficients of linear expansion between the oxide film and a semiconductor substrate, i.e., silicon, and the thermal oxide film is produced at a high temperature in the vicinity of 1,000° C., a thermal stress is generated in the semiconductor substrate and the thermal oxide film in the vicinity of room temperature. In particular, steep stress distribution (gradient) is generated in the vicinity of the boundary between both materials. Furthermore, the generated stress changes depending on the production temperature of the thermal oxide film, the oxide film thickness, the plane layout dimension or the like.

High integration of a semiconductor device is being expedited in recent years, but a trend to increase a circuit current or current density for improving a response speed of a device is shown in a high speed device in particular, thus requiring also to increase a required oxide film thickness for securing electrical insulation from an adjacent device. The film thickness of 0.5 $\mu$m to 1.0 $\mu$m has been heretofore sufficient, but it becomes necessary to secure the film thickness of 2 $\mu$m or more as occasion demands. As a result, a spread region of a stress field (a stress distribution (gradient) forming region) formed in the vicinity of the boundary between the oxide film and the semiconductor region is also expanded. When a stress field is formed in a semiconductor region, variation is generated in various electrical characteristics of the circuit device.

There is a piezoresistance effect as a typical factor for variation. This phenomenon is one in which electrical resistivity of a semiconductor is varied when a stress (a strain) is generated in a semiconductor region. Thus, when a diffused resistor is formed in the region where the stress field is generated, the resistance value of the resistor is shifted from a designed value in accordance with the stress field. Since the variation of the resistance value of the resistor produces such a phenomenon that variation of an amplification factor in an amplifier circuit is caused, a resonance frequency is shifted in a resonance circuit and so on. Therefore, reliability is detracted by a large margin depending on the product.

As the integration of a semiconductor device (element) is accelerated and more complication of an element structure or more diversification of an element forming material is aimed at hereafter, a tendency that the increase of the stress inside the device (element) is unavoidable is shown, thus producing possibility of causing such a problem that the characteristic variation quantity is further increased and the variation quantity in characteristics of the element or the circuit becomes different depending also on the location in accordance with stress distribution generated inside the device. The measurement of residual stress after thermal oxidation of a silicon substrate is described in a literature, H. Miura et al., "Residual Stress Measurement in Silicon Substrates after Thermal Oxidation", Series A, Vol. 36, No. 3, July 1993, pp. 302–308.

When the characteristics of an element or a circuit change in a semiconductor device, such problems that the voltage amplification factor is lowered and a booster circuit becomes no longer operated, an error is generated in signal transmission and so on are generated. When the characteristics of the element or the circuit of the whole device vary uniformly, it is possible to control the variation by compensating for the characteristic variation or designing by taking the variation into consideration, but when the stress distribution is generated inside the device (semiconductor region) and characteristic variation becomes different depending on the location inside the device (semiconductor region), compensation for characteristic variation becomes very difficult.

Accordingly, since the increase of the film thickness of the oxide film for electrical insulation enlarges the stress distribution (gradient) generating region in the vicinity of the boundary between the oxide film and the semiconductor region, and spreads the characteristic variation region of the element or the circuit, a useless region where no circuit is formed becomes necessary in order to assure the product reliability, thus requiring to make the dimensions of the device (semiconductor chip) larger. This fact gives rise to a problem of substantially impeding miniaturization and high integration of the device.

SUMMARY OF THE INVENTION

Thus, it is an object of the present invention to provide a device structure for controlling characteristic variation of an element or a circuit inside a semiconductor device as small as possible even when a stress distribution (gradient) region, i.e., a region where a stress value is changed inside the semiconductor device is enlarged with the increase of the film thickness of the oxide film for isolation for aiming at electrical insulation between adjacent semiconductor devices (elements or circuits) and a method of designing the same.

In order to achieve the above-mentioned object, according to the present invention, in a structure of a semiconductor device having a semiconductor element forming region and an oxide film for isolation, such a structure is formed that a part of semiconductor elements such as diffused resistors or transistors formed in the semiconductor element forming region or the circuits obtained by connecting these semiconductor elements electrically are allowed to be arranged in the vicinity of the oxide film boundary, and the other circuit portions are formed being separated from the oxide film boundary by a predetermined range determined by the width of the stress distribution region.

Namely, a semiconductor device of the present invention has a thermal oxide film for isolation and a semiconductor region for forming an element surrounded by the thermal oxide film for isolation, in which a diffused layer (preferably a rectangular diffused resistance layer. Besides, a combination of diffused layers like a transistor is included in the present invention) is formed in the semiconductor region. In this semiconductor device, (1) a distance between an end portion that is the closest to the thermal oxide film for isolation of the diffused layer and the end of the thermal oxide film for isolation shows a predetermined value or higher determined by the stress distribution inside the semiconductor region, (2) the distance between the end portion that is the closest to the thermal oxide film for isolation of the diffused layer and the end of the thermal oxide film for isolation is at least 4 $\mu$m or more when it is four times of the oxide film thickness for isolation, i.e., the depth from the semiconductor substrate surface of the oxide film, and the thickness of the thermal oxide film for isolation, i.e., the depth from the surface is 1 $\mu$m or more, and is at least 8 $\mu$m or more when the depth of the thermal oxide film for isolation is 2 $\mu$m or more, (3) the longitudinal direction of the diffused layer portion formed from the end of the thermal oxide film for isolation over to the stress distribution (gradient) forming region in the semiconductor region is parallel to the forming direction of stress gradient, or (4) resistance value distribution is formed parallel to stress gradient in the diffused layer formed from the end of the thermal oxide film for isolation over to the stress distribution (gradient) forming region in the semiconductor region.

Besides, it is a matter of course that two or more features described in the above items (1) to (4) can be provided at the same time.

Further, a design method of the present invention is featured in that the distance between the end portion closest to the thermal oxide film for isolation of the diffused resistance layer and the end of the thermal oxide film for isolation is determined from the stress distribution in the semiconductor region, the piezoresistance coefficient of the diffused resistance layer and an allowable value of resistivity variation of the diffused layer.

The present invention is effective in particular when the depth of the thermal oxide film for isolation from the substrate surface is 1 $\mu$m or more. Because, a DRAM etc. get stronger against $\alpha$-ray damage, and electrical insulation is made sure against increase of current density by high speed operation in a bipolar device. In particular, meanings are given in respective structures described above with respect to this depth or more.

Further, in the present invention, it is preferable that, in the resistance value distribution of the diffused layer portion, the resistance value increases gradually toward the boundary between the thermal oxide film for isolation and the semiconductor region in the case of n-type, and the resistance value decreases gradually toward the boundary between the thermal oxide film for isolation and the semiconductor region in the case of p-type. It is also preferable that a means for providing distribution on resistance values uses at least one of impurity concentration change and configuration change (the change of dimension in the longitudinal direction or dimension in the width direction).

It is possible to determine a stress field generated in the vicinity of the boundary between the semiconductor element forming region and the oxide film for isolation by a method of stress analysis using a finite element method or an experimental stress measurement method using a laser Raman method or x-ray stress measurement or the like. It is possible to predict the resistivity variation width of a diffused resistor formed at an optional location in the semiconductor forming region from the obtained value of the stress field and a piezoresistance coefficient matrix. After the piezoresistance coefficient and predicted resistance variation distribution are obtained, the dimension (the distance from the oxide film boundary) of the region where no diffused resistor is formed is determined in accordance with the allowable width of resistance variation required for every product, as will be described in detail later.

Further, even if a diffused resistor is formed in the stress distribution (gradient) forming region, it becomes possible to manufacture a product without marring product reliability even when a stress is generated while achieving high integration of a semiconductor product, as will be described in detail later.

When the semiconductor device or the design method described above are applied, it becomes possible to control characteristic variation of a semiconductor element or circuit as low as possible even when stress distribution (gradient) is formed in the vicinity of the boundary between the oxide film for isolation and the semiconductor element forming region, thus the product reliability is not lowered.

DESCRIPTION OF THE PREFERRED EMBODIMENTS

Figure 1:
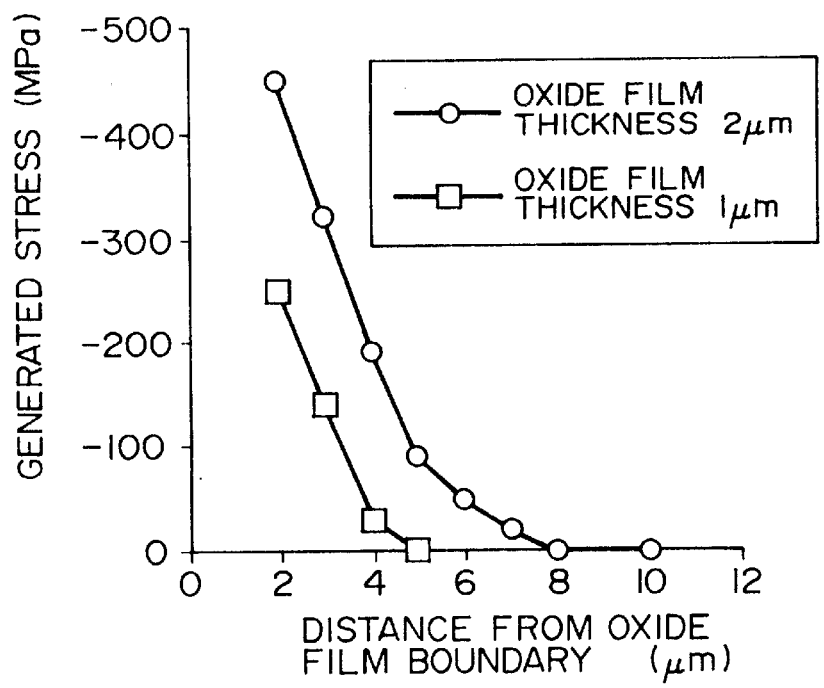
FIG. 1 is a stress distribution diagram of a semiconductor device according to an embodiment of the present invention.

Even when a stress distribution region width is widened, and high integration of a device is hindered, a semiconductor element or circuit has to be also formed in the stress distribution forming region sometimes. In this case, it is sufficient to predict in advance a variation quantity of device characteristics generated due to formation of stress distribution and form the element or the circuit, in the case of a plurality of diffused resistors for instance, by providing distribution (shift) to the resistance values thereof so that respective characteristics after variation show predetermined values.

It becomes possible to obtain predetermined resistance values (distribution) when the distribution of the resistance values provided at the initial stage (the design stage) and the resistivity variation distribution due to a piezoresistance effect attendant upon stress generation after manufacturing a semiconductor device are offset each other.

As a method of providing the resistance value distribution to a diffused resistor at an initial stage (design stage), it is warrantable to provide distribution in concentration of impurities diffused in the resistor, to provide distribution in resistor dimensions (for example, the width dimension or the length dimension of a rectangular resistor) while maintaining the impurity distribution constant, or to execute combinations thereof.

Further, there is anisotropy depending on a crystallographic axis orientation of a single-crystalline semiconductor substrate in a piezoresistance effect, and furthermore, the degree or the sensitivity of resistivity variation against the stress are also different depending on the type of impurities used for producing the diffused resistor (whether an element of group 5 is diffused or an element of group 3 is diffused as the impurity element when silicon is used as a semiconductor substrate for instance). It also becomes possible to control the variation of element or circuit characteristics attendant upon generation of stress distribution by applying this principle.

When the diffused resistor is formed in the vicinity of a single-crystalline substrate surface for instance, it is possible to make the variation of resistivity attendant upon stress generation to the minimum when an element of group 3 (such as boron (B)) is used and the longitudinal direction of the resistor is formed parallel to the <100> crystallographic direction of a silicon crystal.

Accordingly, when it is desired to produce a diffused resistor in a region where stress distribution (gradient) is formed, it is sufficient to use an element of group 3 (such as boron (B)) and form a resistor with the longitudinal direction of the resistor parallel to the <100> crystallographic direction of the silicon crystal.

In case an element of group 3 cannot be used as an impurity element used for forming the resistor or the longitudinal direction of the diffused resistor cannot be formed in the <100> crystallographic direction of the silicon crystal, it is possible to make the piezoresistance coefficient (resistance regulation for unit stress) small in principle by making the concentration of introduced impurities high. Namely, since the resistivity is lowered when the impurity concentration is increased, it becomes possible to realize a semiconductor element or circuit having small resistivity variation against stress generation without lowering the integration degree when a diffused resistor having high impurity concentration and low resistance is provided in the region where stress distribution (gradient) is formed in a semiconductor device.

Furthermore, such a semiconductor element or circuit that the product reliability is not lowered if the resistivity variation quantity of an adjacent resistor for instance is constant even when variation of the resistivity occurs is also in existence. There is a diffused resistor used in a differential amplifier circuit as such an example. When it is desired to provide such a circuit in the vicinity of the boundary between the oxide film for isolation and the semiconductor forming region, it is possible to make resistivity variation quantities of adjacent resistors almost the same to each other when the longitudinal direction of the diffused resistor in a direction meeting at right angles with the boundary, in other words, parallel to the generating direction of stress distribution (gradient).

Although resistance values (resistivities) of respective resistors vary with the generation of stress distribution, no influence is exerted upon the circuit operation of the differential amplifier since the changes of adjacent resistors become constant. Thus, the product reliability is not marred.

In a manufacturing process of a semiconductor element, absolute values of the stress distribution (gradient) generated in the vicinity of the boundary between the oxide film for isolation and the semiconductor element forming region or the width dimension of the distribution forming region can be predicted by stress analysis disclosed in Ser. No. filed on Jul. 5, 1994. A stress analysis method in which a finite element method is applied may be used as the stress analysis method for instance.

It is preferable to perform the stress analysis taking not only the analysis of thermal stress originated in the difference of coefficient of thermal expansion between an oxide film and a semiconductor (such as silicon), but also the stress generated due to cubical expansion of the oxide film at time of oxidation reaction, an internal stress (intrinsic stress) of a deposited thin film or the like into consideration. With this, it is possible to aim at improvement of the accuracy of the result of stress analysis.

The prediction of the resistivity variation quantity of the diffused resistor in the stress distribution (gradient) forming region can be computed from the piezoresistance coefficient of the diffused resistor and the generated stress field. The piezoresistance coefficient is a function of a type and concentration of impurities forming a diffused resistor or a crystallographic direction inside the silicon substrate for forming the resistor, and it is possible to predict the resistivity (value) variation quantity of each diffused resistor by inputting those values and inputting the stress field resulted from stress analysis.

Further, when the analysis method is applied in contrast with the above, it also becomes possible to determine such type and concentration that bring the regulation (quantity) of the resistivity to a predetermined value or below or the crystallographic direction forming the resistor. Thus, it also becomes possible to provide distribution in advance in the impurity concentration forming a diffused resistor so that the final resistance value shows a predetermined value or to provide distribution in the resistor configuration or the layout thereof inside the stress distribution (gradient) generating region from the result of analysis of stress distribution and piezoresistance analysis.

Further, as a layout method of a plurality of resistors, it also becomes possible to determine the type and the concentration of impurities, crystallographic directions or arrangement locations (for example, those that are allowable notwithstanding wide resistivity variation width are arranged in the vicinity of the boundary with the oxide film for isolation) taking the resistivity variation width required to respective resistors into consideration.

The piezoresistance effect in a semiconductor is expressed in tensor display by the following expression, as follows.

$$\{\Delta \rho_i / \rho_i\} = \{\pi_{ij}\}\{\sigma_j\} \qquad (1)$$

Here, $\Delta \rho_i / \rho_i$, $\sigma_j$ (i,j=1 to 6) represent three dimensional components of the resistivity variation and stress, and $\{\pi_{ij}\}$ represents a tensor quantity in 6 rows and 6 columns called a piezoresistance matrix. Each element of matrix is referred to as a piezoresistance coefficient. Thus, 36 pieces of independent constants are in existence in general as the piezoresistance coefficients.

In a material having a cube symmetric crystal structure like silicon, however, it has been clarified that there are only three coefficients that are independent of the symmetric property of the structure. For example, when the <100> crystallographic axis of silicon and xyz orthogonal three axes are made to coincide with one another, the independent coefficients are three in number, that is, $\pi_{11}$, $\pi_{12}$ (=$\pi_{21}$=$\pi_{13}$=$\pi_{31}$=$\pi_{32}$=$\pi_{23}$) and $\pi_{44}$ (=$\pi_{55}$=$\pi_{66}$). Accordingly, when these three coefficients are known, it is possible to compute the piezoresistance coefficient in an optional crystallographic direction by calculus of vectors taking rotation of coordinates into consideration.

It is possible to determine the piezoresistance coefficient of the diffused resistor formed on a semiconductor substrate (silicon) by the combination of a four-point bending test method and a hydrostatic test method on a diffused resistor for instance. A case that a rectangular diffused resistor is formed in the <110> crystallographic direction on the (100) crystal plane of a silicon single crystal used most generally in the manufacture of a semiconductor device will be discussed.

It is assumed that the longitudinal direction of the diffused resistor is the x-axis direction, the width direction thereof is the y direction, and the direction normal to the (100) crystal plane is the z direction. When a current is applied in the longitudinal direction (x direction) of the diffused resistance layer so as to use it as a resistor, variation attendant upon the stress of the diffused resistor is expressed by the following expression.

$$\Delta R/R = 1/2\{\pi_{11} + \pi_{12} + \pi_{44}\}\sigma_x + 1/2\{\pi_{11} + \pi_{12} - \pi_{44}\}\sigma_y + \pi_{12}\sigma_z \qquad (2)$$

Here, $\Delta R/R$ represents a resistance value change of the resistor, $\pi_{ij}$ represents a piezoresistance coefficient described previously and $\sigma_j$ represents a normal stress component in the j direction acting on the resistor. When the four-point bending test is performed on the resistor, it is possible to separate and determine the coefficients $\pi_{11}+\pi_{12}$ and $\pi_{44}$ from the above expression since known one-axis stress $\sigma_x$ or $\sigma_y$ can be loaded.

Furthermore, since it is possible to determine the coefficient $\pi_{11}+2\pi_{12}$ when hydrostatic pressure ($\sigma_x=\sigma_y=\sigma_z=\sigma$) is loaded, it is possible to separate and determine independent three piezoresistance coefficients $\pi_{11}$, $\pi_{12}$ and $\pi_{44}$ with the measurement described above. The examples of the piezoresistance coefficients thus obtained are shown in Table 1. Respective piezoresistance coefficients are obtained from a diffused resistor having a sheet resistance of approximately 100 Ω/□.

TABLE 1

|  | $\pi_{11}$ | $\pi_{12}$ | $\pi_{44}$ |
| --- | --- | --- | --- |
| p-type | 5.7 | −2.3 | 125 |
| n-type | −48.4 | 25.3 | −11.3 |

The stress field generated in the vicinity of the boundary between the semiconductor element forming region and the oxide film for isolation can be determined by stress analysis using a finite element method, an x-ray stress measuring method or an experimental stress measuring method using a Laser Raman method or the like.

FIG. 1 shows a stress analysis example. In FIG. 1, the axis of abscissas represents the distance from the boundary between the oxide film and the element forming region toward the inside of the element forming region, and the axis of ordinates represents a vertical stress component in a perpendicular direction to the boundary, in which the oxide film thickness shown in the figure is adopted as an analysis parameter. It is realized from the present analysis example that the stress distribution (gradient) generating region depends also on the oxide film thickness.

In the present analysis example, the stress field is formed up to the region approximately 8 μm from the oxide film/the semiconductor forming region when the oxide film thickness is 2 μm, but the stress distribution forming region is up to approximately 5 μm when the oxide film thickness is 1 μm. It becomes possible to predict the resistivity variation width of the diffused resistor formed at an optional location in the semiconductor forming region from the value of the stress field thus obtained and the piezomatrix.

Figure 2:
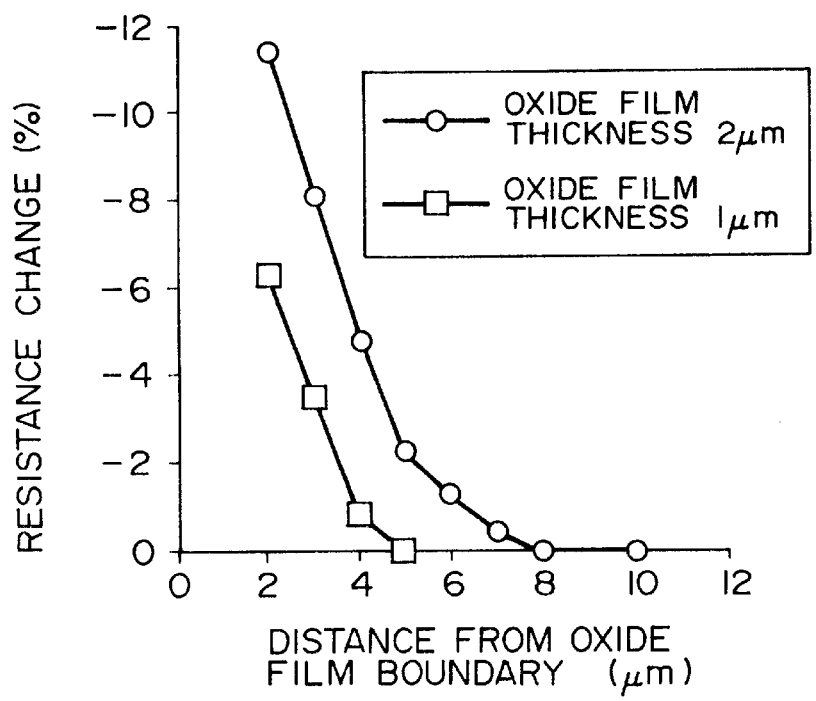
FIG. 2 is a resistivity change distribution diagram of a semiconductor device according to an embodiment of the present invention.

A three dimensional analysis result (stress field) is required in order to make a strict argument practically, but the piezoresistance coefficients of the n-type resistor in Table 1 and the resistance variation distribution predicted from the following expression (3) can be obtained as shown in FIG. 2 when it is assumed that the stress field can be approximated in one direction (one-axis stress field: $\sigma_y$) for the sake of simplicity.

$$\Delta R/R \sim \pi_{12} \cdot \sigma_y \qquad (3)$$

Thereafter, it is sufficient to determine the dimension (the distance from the oxide film boundary) of the region where the diffused resistor is not formed in accordance with the resistance variation allowable width required for each product. For example, when the resistance variation allowable width is 1%, it becomes possible to manufacture a product without lowering the product reliability even if the stress field is formed in the semiconductor element forming region when the diffused resistor is formed apart from the oxide film boundary by 4 µm in a product having the oxide film thickness of 1 µm and by 8 µm in a product having the oxide film thickness of 2 µm, respectively.

It goes against the trend of high integration of a semiconductor product to provide a region where no diffused resistor is formed even in 4 µm or 8 µm, and it means to provide an entirely useless region. So, a further effective method of forming a diffused resistor in the stress distribution (gradient) forming region is considered. Since it is known in advance that the resistivity (value) varies as shown in FIG. 2 due to the generation of the stress distribution (gradient), it is possible to obtain a uniform or a predetermined distribution of the resistivity (value) obtainable finally with a practical product if a reverse resistivity (value) distribution with the resistivity (value) variation taken into consideration is formed when the stress is not generated.

Figure 3:
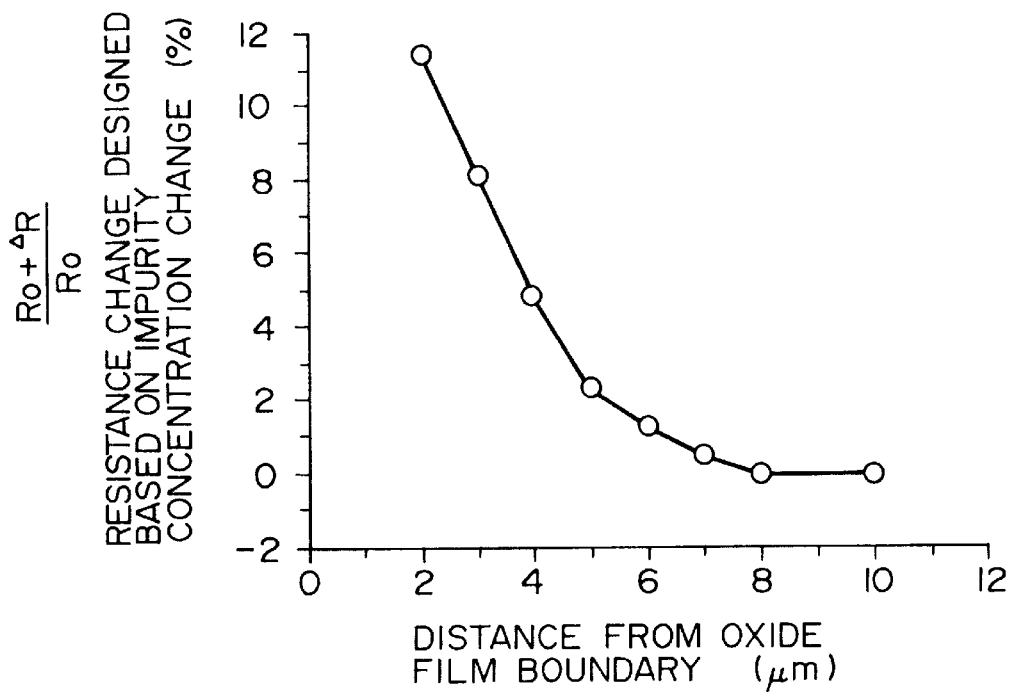
FIG. 3 is an explanatory diagram for explaining formation of resistivity distribution (impurities) in a semiconductor device according to an embodiment of the present invention.

Namely, the diffused resistor is formed so as to show the resistivity (value) distribution such as shown in FIG. 3. In the present example, such a distribution that the resistivity (value) increases toward the oxide film boundary side. In order to realize such resistivity (value) distribution, it is sufficient to make the impurity concentration introduced in the formation of the diffused resistor lower toward the oxide film boundary. Otherwise, the resistor configuration may also be changed while maintaining the impurity concentration constant. For example, it is sufficient to make the aspect ratio (the ratio of the length L to the width W (L/W)) of the resistor larger gradually as approaching the film boundary when a rectangular resistor is formed for instance. When the resistivity (value) distribution is formed in advance by a method as described above, a stress field is formed practically and the resistivity varies (increases in FIG. 2 of the present example) at respective locations by the piezoresistance effect. Thus, it is possible to finally obtain uniform (or predetermined) resistivity (value) distribution. With this, it becomes possible to form a diffused resistor also in the stress distribution (gradient) forming region, thus making it possible to manufacture a product in which the product reliability is not marred even when the stress is generated while achieving high integration of the semiconductor product.

In order to aim at improvement of reliability of a product, it is also effective to make use the impurity concentration dependence of piezoresistance coefficient of a diffused resistor formed in the stress distribution forming region. The impurity concentration dependency is in existence in the value of the piezoresistance coefficient, and the value of the piezoresistance coefficient is reduced monotonously as the impurity concentration gets higher.

Figure 4:
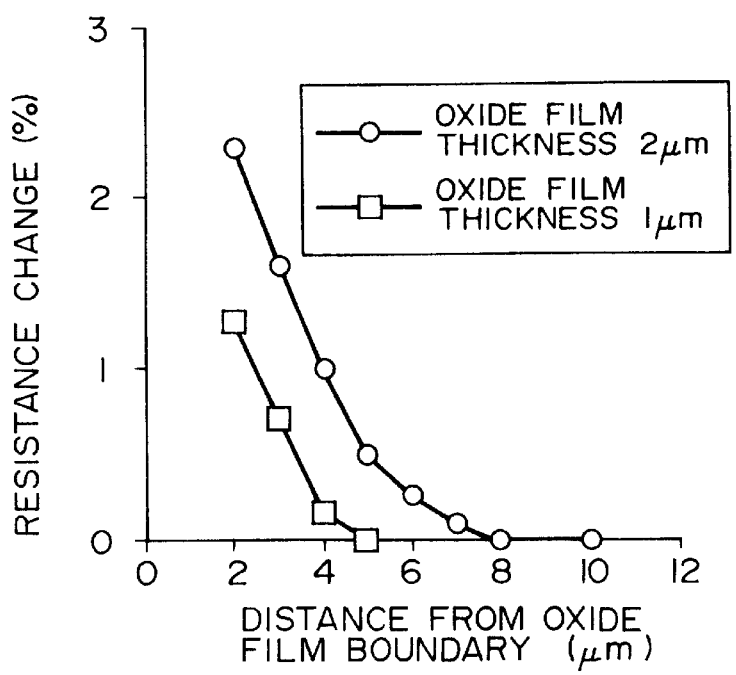
FIG. 4 is an explanatory diagram for explaining low resistivity change distribution of a semiconductor device according to an embodiment of the present invention.

Thus, when a diffused resistor having high concentration is formed in a region where the stress distribution (gradient) is generated, it becomes possible to control the characteristic change of a product so as to show a predetermined value or below even if the stress is generated. When the impurity concentration is increased from $10^{18}/cm^3$ to $10^{20}/cm^3$, the piezoresistance coefficient becomes approximately ⅕. Therefore, the resistivity (value) variation distribution shown in FIG. 2 changes as shown in FIG. 4, thus identifying that the region where the resistor can be formed (for example, the regulation is 1% or below) is increased by a large margin.

Since the resistivity is also lowered when the impurity concentration is increased, however, it is preferable to apply this method to a case when a diffused resistor having a low resistance value is arranged in this region. This is because of such a reason that it is indispensable to make the resistor larger (for example, to make the ratio L/W of the length L to the width W larger) in order to form a diffused resistor having high impurity concentration and high resistance, and this method is not suitable for high integration of the semiconductor product. This does not apply when a resistor of a high resistance value has to be formed in this region by all means.

Furthermore, there is a method of applying crystal anisotropy of the piezoresistance effect as the method of making the value of the piezoresistance coefficient smaller. When a rectangular diffused resistor is formed for instance, the piezoresistance coefficient changes as an angle formed between the longitudinal direction thereof and the crystallographic direction changes. As an example, when a resistor is formed on the <110> crystallographic direction on the (100) crystal plane of single-crystalline silicon, the resistivity (value) variation quantity for the stress is expressed by the expression (2).

Besides, the x- and y-axes are made to coincide with the <110> crystallographic direction in the (100) crystal plane, and the z-axis is made to coincide with the direction perpendicular to the (100) plane, respectively. On the other hand, when the longitudinal direction of the resistor is formed parallel to the <100> crystallographic axis, the resistivity (value) variation quantity is expressed by the following expression. Here, x-, y- and z-axes are assumed to be defined in the same manner as the previous case.

$$\Delta R/R = \frac{1}{2}\{\pi_{11}+\pi_{12}\}\{\sigma_x+\sigma_y\}+\pi_{12}\sigma_z+\{\pi_{11}-\pi_{12}\}\tau_{xy} \quad (4)$$

Accordingly, when a p-type resistor is formed for instance, the following expressions are obtained when the values of respective piezoresistance coefficients shown in Table 1 are substituted. That is:

in the <110> direction:

$$\Delta R/R = 64.2\sigma_x - 60.8\sigma_y - 2.3\sigma_z \quad (5)$$

in the <100> crystallographic direction:

$$\Delta R/R = 1.7\sigma_x + 1.7\sigma_y - 2.3\sigma_z + 8.0\tau_{xy} \quad (6)$$

Here, σ represents a normal stress component, and τ represents a shear stress component.

Accordingly, in the present example, the piezoresistance coefficients for the normal stress components $\sigma_x$ and $\sigma_y$ in the (100) crystal plane are different by even 40 times depending on the crystallographic direction forming the resistor. Therefore, when a diffused resistor is formed in a region of high generated stress, selection of the formed crystallographic direction is also important, and it becomes possible to reduce the resistivity variation quantity to approximately 1/40 only by altering the direction of the resistor formed in the <110> crystallographic direction to the <100> crystallographic direction.

There is also such a case that no influence is exerted at all on the circuit operation from a viewpoint of assuring the product reliability when the resistivity of the resistor varies uniformly over the whole circuit even if the resistivity (value) varies.

Figure 5:
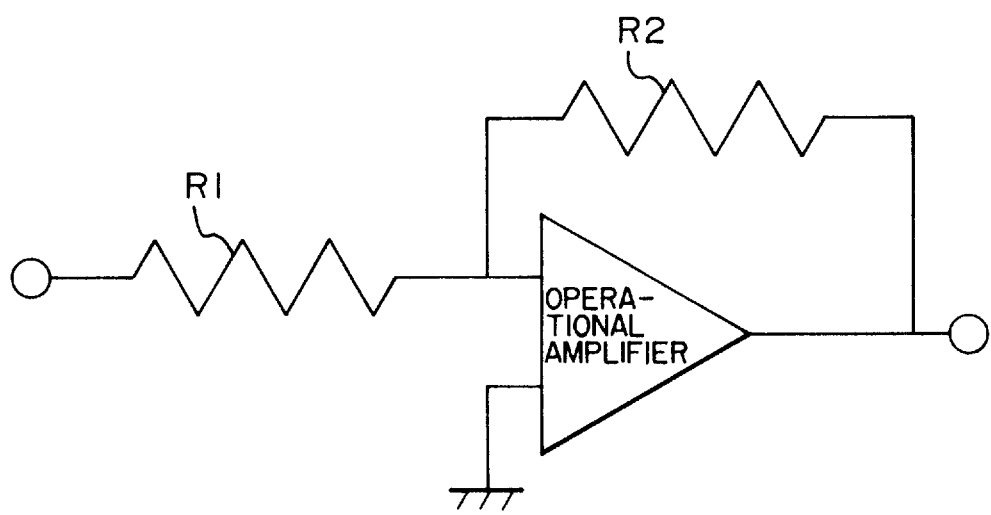
FIG. 5 is an explanation diagram of an amplifier circuit of a semiconductor device according to an embodiment of the present invention.

For example, such an amplifier circuit as shown in FIG. 5 is considered. The voltage amplification G of the amplifier circuit is determined by the ratio of resistance values of connected two resistors as follows.

$$G = -R1/R2 \quad (7)$$

Therefore, when the resistances R1 and R2 change uniformly, no influence is exerted on the circuit operation. Thus, it becomes possible to form a diffused resistor used in such a circuit also in the stress distribution (gradient) generating region.

Figure 6:
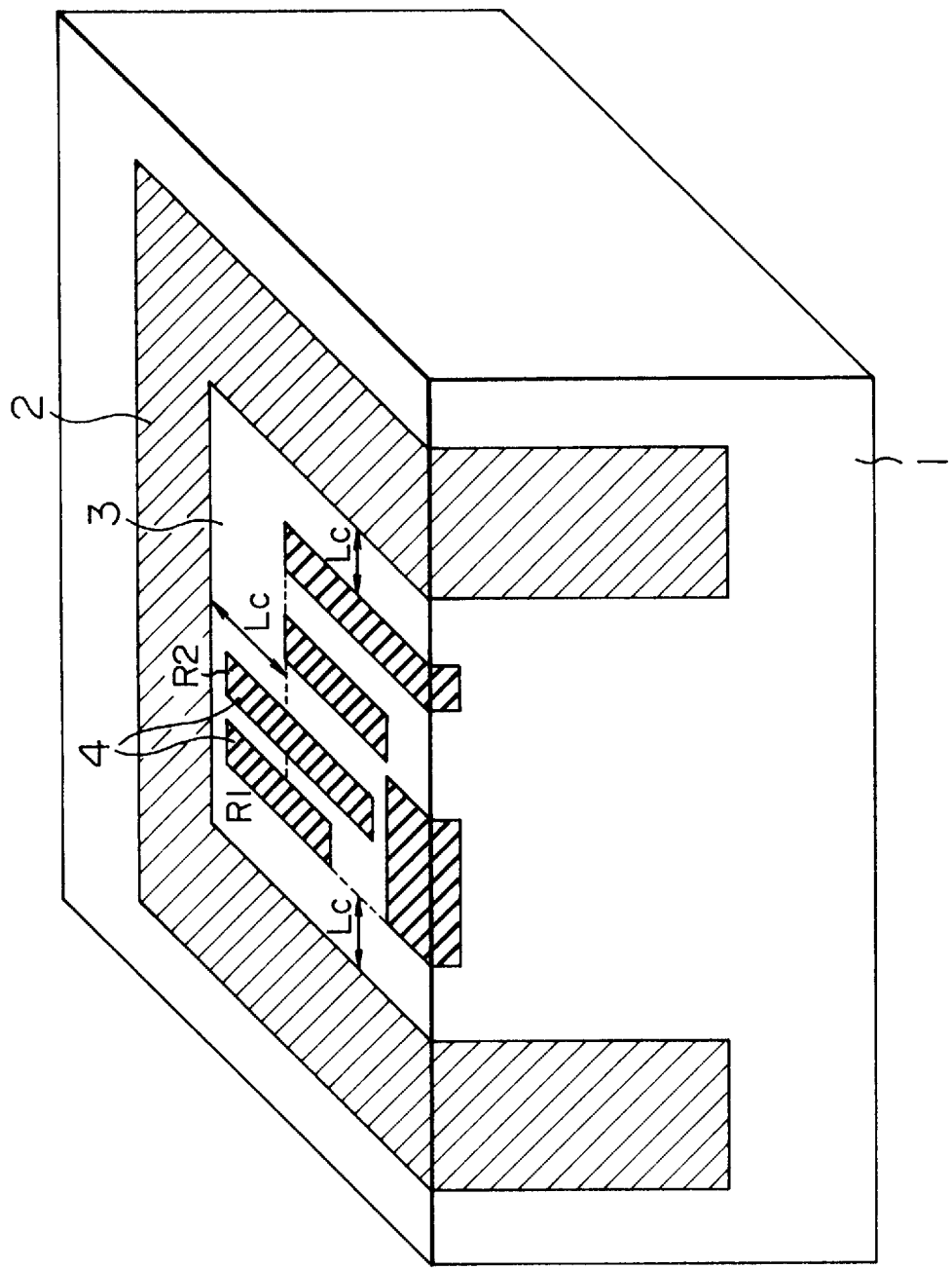
FIG. 6 is a diffused resistance arrangement plan of a semiconductor device according to an embodiment of the present invention.

A case that the resistors R1 and R2 are formed with an arrangement meeting at right angles with the boundary between the oxide film for isolation and the semiconductor element forming region as shown in FIG. 6 for instance will be discussed. Since the stress distribution (gradient) is formed in the longitudinal direction of the resistor as have been described so far, the resistance values (resistivities) vary respectively. In this case, since the stress distribution is formed only in the longitudinal direction of the resistor (uniform in the width direction) if the end of the resistor in the width direction (y-direction shown in the figure) is sufficiently apart from the oxide film for isolation (for example, Lc=7 $\mu$m or longer), the resistance value variation quantities of R1 and R2 become uniform. Accordingly, even if the stress distribution (gradient) is generated in the resistor forming region in this case, no influence is exerted upon the amplifier circuit operation and the product reliability will never be lowered.

When the semiconductor device structure or the manufacturing method described above are applied, even when the stress distribution (gradient) is formed in the vicinity of the boundary between the oxide film for isolation and the semiconductor element forming region, it becomes possible to control the characteristic variation of the semiconductor element or circuit as low as possible, and the product reliability is not lowered.

Figure 7:
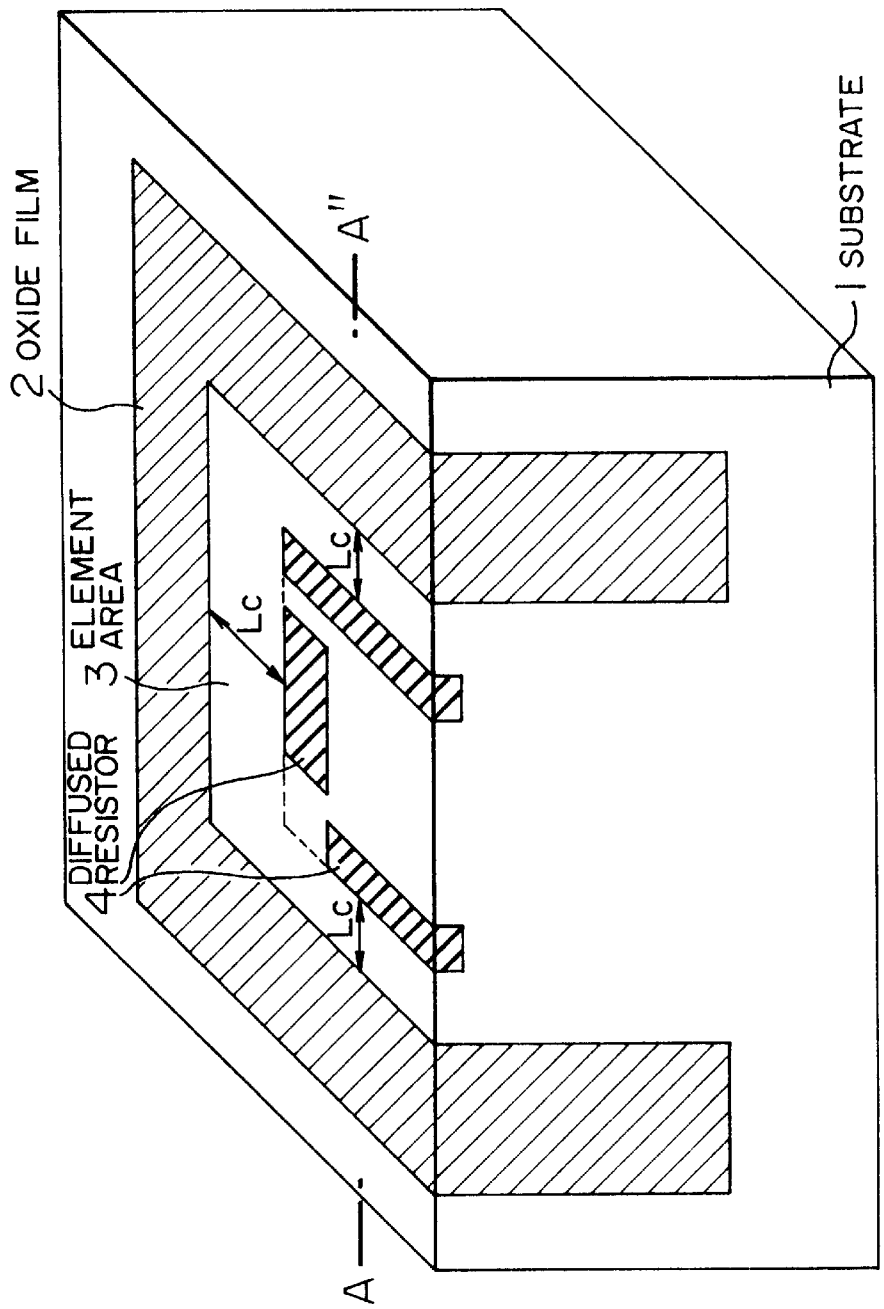
FIG. 7 is a diffused resistor structural plan of a semiconductor or device according to an embodiment of the present invention.

FIG. 7 shows a three-dimensional structural view of a semiconductor device, FIG. 1 shows a stress distribution diagram taken along a line A-A" in FIG. 7, and FIG. 2 shows a resistivity variation distribution diagram taken along a line A-A" in FIG. 7, respectively. In a semiconductor device of the present embodiment, diffused resistors 4 forming a part of a semiconductor circuit are formed apart from a boundary between an oxide film 2 for isolation and a semiconductor element forming region 3 by at least a distance Lc in a semiconductor element forming region 3 with the circumference surrounded by a thermal oxide film 2 for isolation in the vicinity of the surface of a semiconductor substrate 1. The distance Lc is determined as follows.

FIG. 1 shows an example of a stress distribution diagram in the vicinity of the surface of the semiconductor element forming region along a line A-A" in FIG. 7. There is a difference in the coefficient of thermal expansion between the thermal oxide film 2 for isolation and the semiconductor element forming region (such as silicon) 3 forming a semiconductor device, and the oxide film for isolation is formed at a high temperature of approximately 1,000° C. Therefore, a thermal stress is generated during the cooling process down to room temperature.

Furthermore, since this oxide film is formed by thermal oxidation of the silicon substrate 1 in many cases, and cubical expansion is also generated when silicon (Si) is changed into an oxide film ($SiO_2$), the stress is also generated during the thermal oxidation reaction.

The stress distribution such as shown in FIG. 1 is formed as the composite result of these stress generating processes. The absolute value of the generated stress or the spread width of the distribution change depending on the oxide film thickness as shown in the figure, and also change with the oxidation temperature, the oxidation atmosphere (oxidizing gas) or the like. Such stress distribution is also obtainable by using an experimental stress analysis method such as a stress analysis method using a finite element method, a microscopic Raman method and an X-ray diffraction method. When such stress distribution is generated, the resistivity (value) of the semiconductor element forming region or the diffused resistor formed in the forming region vary by the piezoresistance effect as described previously.

FIG. 2 shows the result obtained by using the piezoresistance coefficient of the n-type resistor shown in Table 1, and analyzing the positional dependency of the resistivity variation quantity of the diffused resistor. In order to control the resistivity variation quantity at 1% or lower when the oxide film thickness is 2 $\mu$m, it is required to set the value of Lc to 6 $\mu$m or more. In order to make the value of Lc smaller, it is effective to make the oxide film thickness thinner, and it becomes possible to set the value of Lc to as small as 4 $\mu$m in case it can be made thin down to 1 $\mu$m.

The oxide film for isolation is formed with a thermal oxide film in the present embodiment, but the oxide film may be formed by using a thin film deposition method such as a sputtering method or a chemical vapor deposition method (CVD method), or may also be formed by partially using a thermal oxidation method and a thin film deposition method jointly. However, since the stress distribution shown in FIG. 2 also changes when the oxide film forming method is altered, the value of Lc described in the present embodiment also changes in accordance with the oxide film forming method.

As described, it becomes possible in the present embodiment to control the resistivity variation quantity of the diffused resistor formed in the semiconductor element forming region to a predetermined value (e.g., 1%) or lower.

Figure 8:
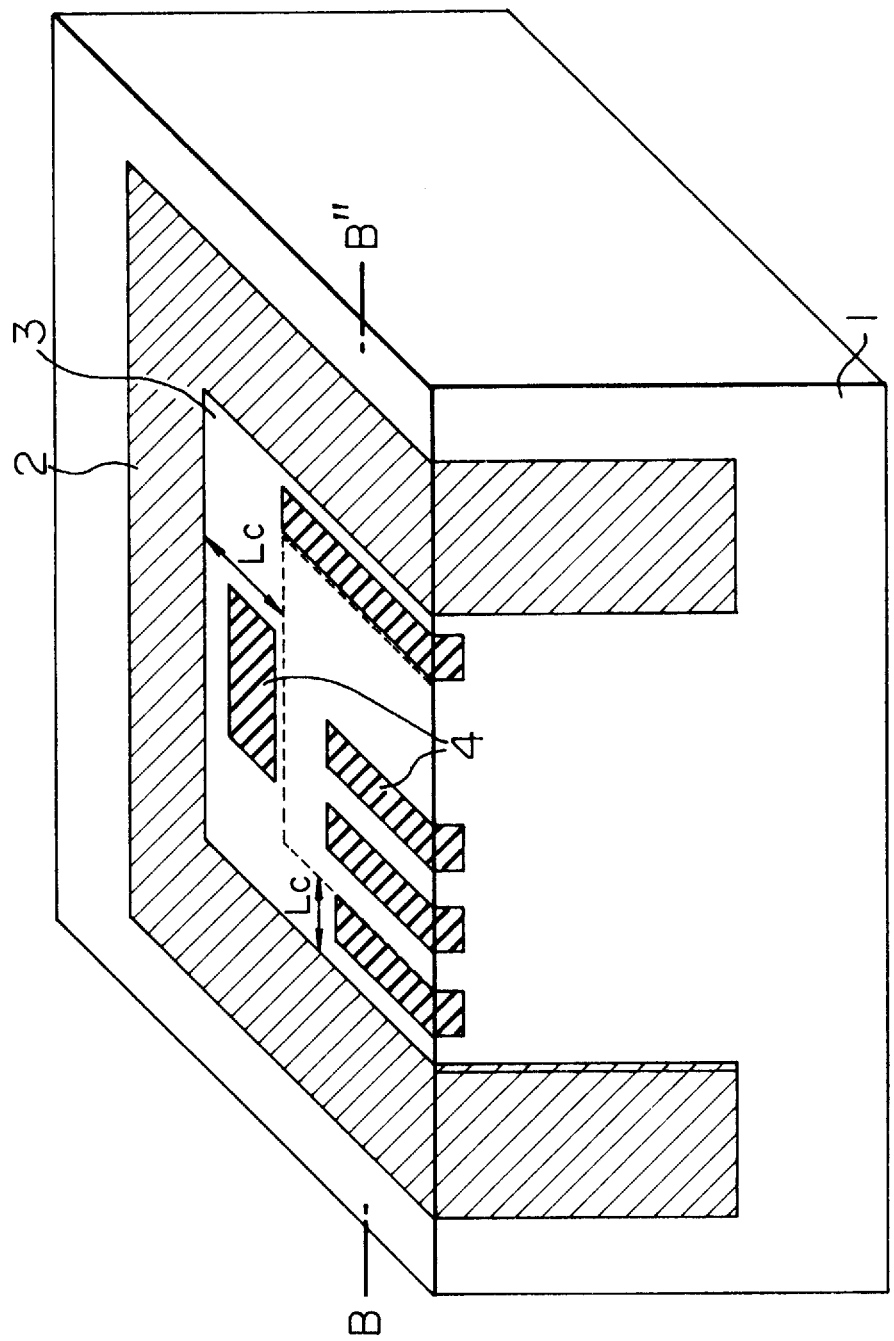
FIG. 8 is a diffused resistor arrangement plan of a semiconductor device according to an embodiment of the present invention.
Figure 9:
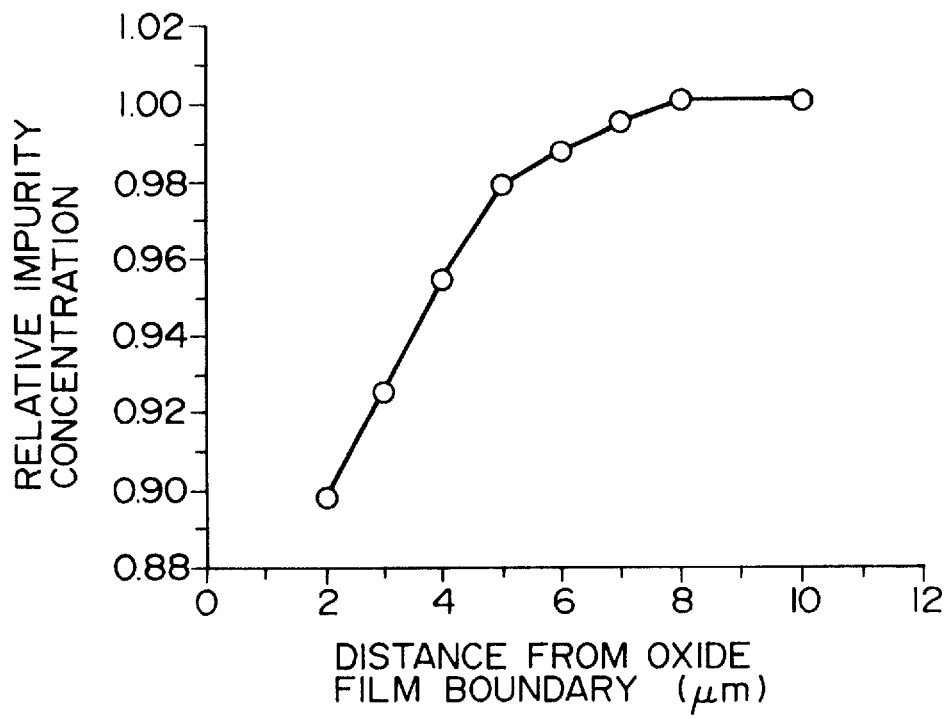
FIG. 9 is an explanatory diagram for explaining an impurity concentration profile of a semiconductor device according to an embodiment of the present invention.
Figure 10:
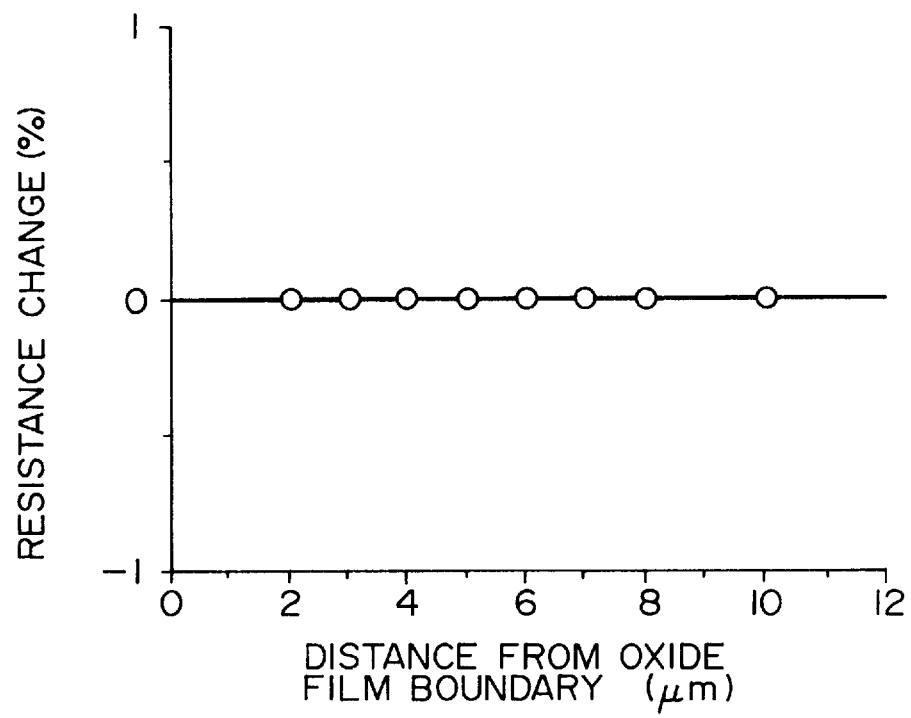
FIG. 10 is an explanatory diagram for explaining resistivity change distribution control of a semiconductor device according to an embodiment of the present invention.

Next, another embodiment of the present invention will be described with reference to FIG. 8, FIG. 9 and FIG. 10. FIG. 8 is a three-dimensional structural view of a semiconductor device that is an embodiment of the present invention. FIG. 9 shows an impurity distribution diagram taken along a line B-B" in FIG. 8, and FIG. 10 shows a resistivity change distribution diagram taken along a line B-B" in FIG. 8, respectively. Since it goes against high integration of a semiconductor device to make provisions that a diffused resistor is not formed within the range of Lc shown in the previous embodiment, the present embodiment is featured by a structure that general diffused resistors that do not form a pair in the range of Lc are formed from a viewpoint of effective utilization of the region.

However, since the resistivity variation quantity of the resistor becomes larger as described in the above-mentioned embodiment when a diffused resistor is simply formed, distribution such as shown in FIG. 9 is provided in the concentration of impurities introduced in forming of the diffused resistor along the line B-B" in FIG. 8 in the present embodiment. When the impurity concentration is constant, the resistivity of an n-type resistor is reduced within the range of Lc as shown in FIG. 2 of the previous embodiment.

Accordingly, when the resistivity of the resistor in this region in case no stress is acting is kept higher than an expected value, it becomes possible to obtain a predetermined resistivity (value) finally when reduction of the resistivity attendant upon stress generation is generated. It is sufficient to make the impurity concentration lower for setting resistivity (value) of the resistor high. It is possible to determine appropriate impurity concentration taking the variation quantity of the resistivity originated in the stress into consideration.

However, since the piezoresistance coefficient also changes sometimes when the impurity concentration is changed as stated in the paragraph of operation, the increase of the resistivity due to decrease of the impurity concentration and the change of the piezoresistance effect have to be considered in order to determine the impurity concentration profile shown in FIG. 9.

As it is apparent from FIG. 10 showing an example of analysis of the resistivity variation distribution taken along the line B-B" in FIG. 8 of the diffused resistor thus formed shown in FIG. 8, it is possible in the present embodiment to control the resistivity variation of the resistor formed in the stress distribution generating region in the vicinity of the boundary between the oxide film for isolation and the semiconductor element forming region at 1% or lower easily.

In the present embodiment, the oxide film for isolation may either be formed by the thermal oxidation method of a silicon substrate or formed using a thin film deposition method as described in the first embodiment. Further, there is no inevitability that the diffused resistor is an n-type resistor, but it may be a p-type resistor. However, since the direction of the resistivity variation originated in the stress is increased sometimes or decreased sometimes due to the sign of the piezoresistance coefficient, it is required to redesign the profile of impurities shown in FIG. 8 in accordance with respective cases.

When it is desired to reduce the resistivity for instance, the impurity concentration has to be made high reversely to the present embodiment. Besides, a case of making the resistance value constant has been described in the present embodiment, but it is a matter of course that the design so as to provide predetermined distribution in the final resistivity (value) distribution may be performed. An additional mask used for ion implantation has a smaller opening portion so that impurity ions may pass through toward the resistor portion to be provided with higher impurity concentration as compared with a mask for providing uniform impurity concentration of the resistor. It is possible to form a resistor in which the impurity concentration is changed stepwise by means of a plurality of additional masks.

As described, it becomes possible in the present embodiment to control the resistivity variation quantity of the diffused resistor formed in the semiconductor element forming region to show a predetermined value (e.g., 1%) or lower.

Figure 11:
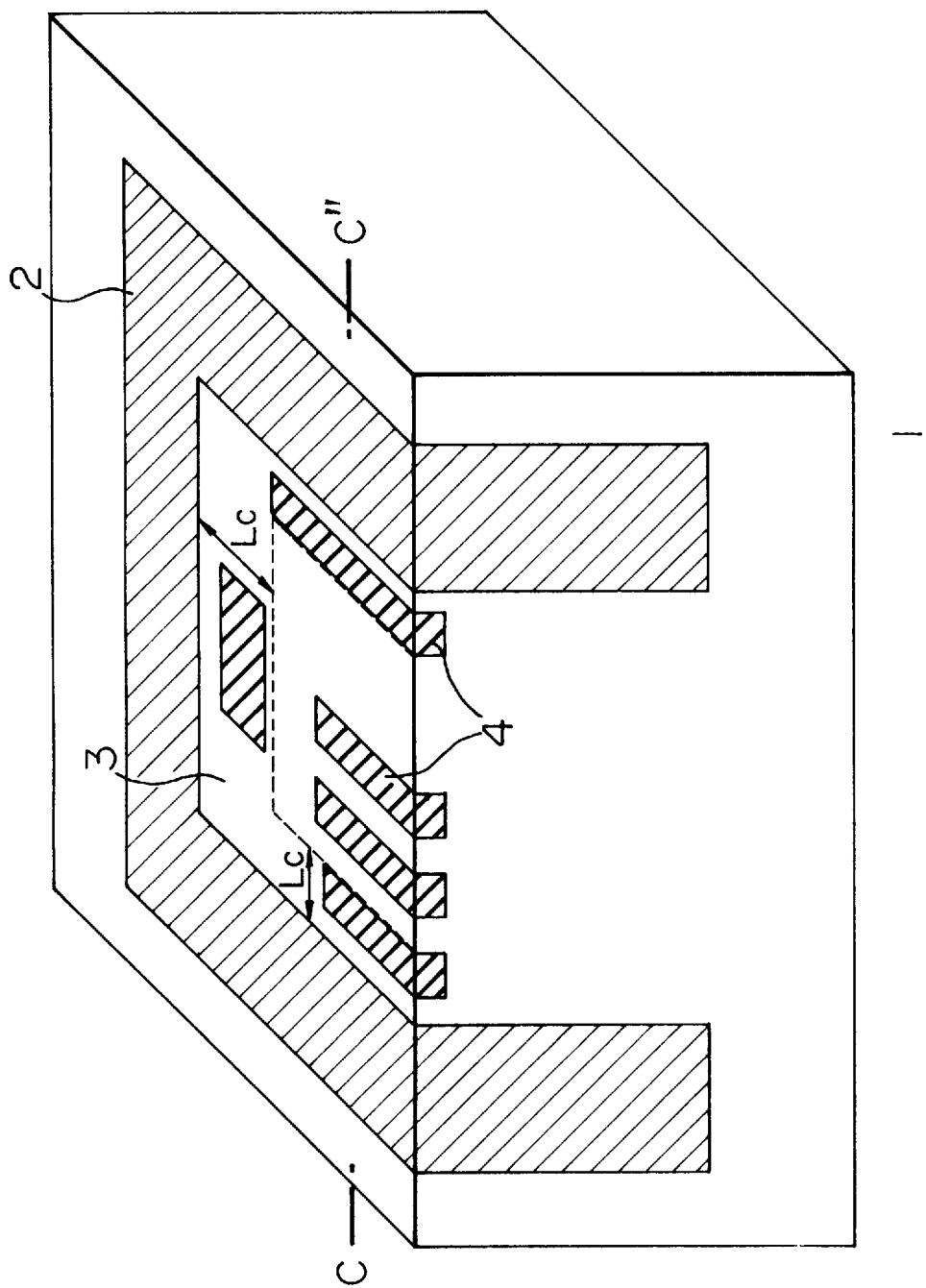
FIG. 11 is an explanatory view for explaining formation of resistivity distribution (configuration) of a semiconductor device according to an embodiment of the present invention.

Next, the third embodiment of the present invention will be described. FIG. 11 shows a three-dimensional structural view of a semiconductor device that is an embodiment of the present invention, FIG. 12 shows a resistor configuration width distribution diagram along a line C-C" in FIG. 11, and FIG. 13 shows a resistivity variation distribution diagram along a line C-C" in FIG. 11, respectively.

Since it goes against high integration of a semiconductor device to provide Lc shown in the first embodiment, the present embodiment is featured by a structure that diffused resistors are also formed in the range of Lc from a viewpoint of effective utilization of the region.

Figure 12:
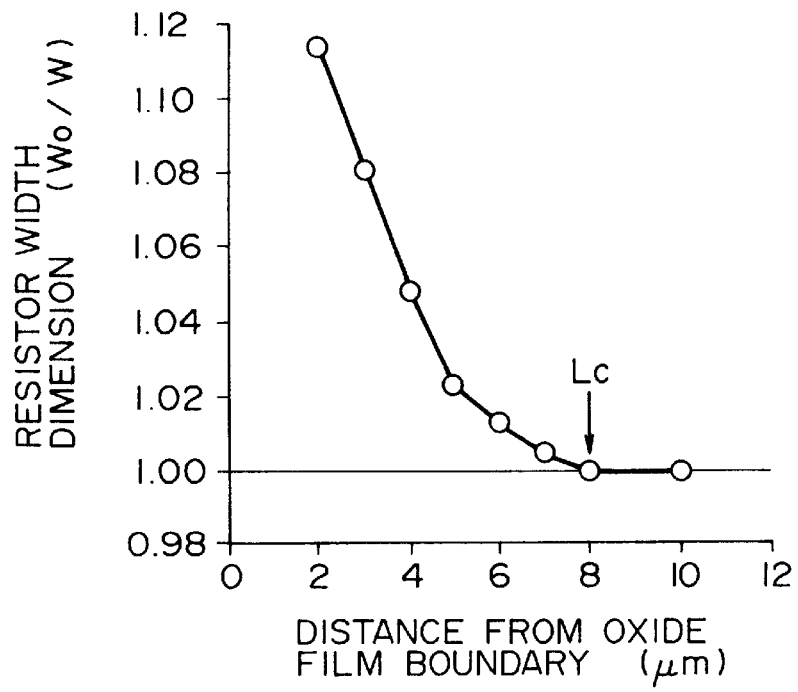
FIG. 12 is an explanatory diagram for explaining a configuration profile of a semiconductor device according to an embodiment of the present invention.
Figure 13:
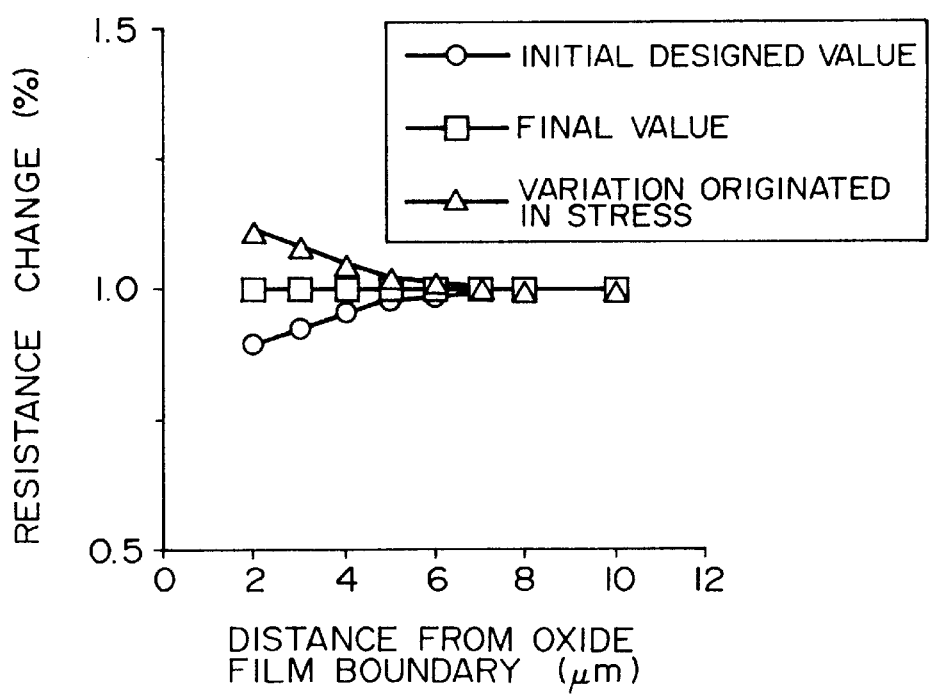
FIG. 13 is an explanatory diagram for explaining resistivity change distribution control (configuration) of a semiconductor device according to an embodiment of the present invention.

However, since the resistivity variation quantity of the resistors becomes larger when only the diffused resistors are formed simply as described in the first embodiment, such distribution as shown in FIG. 12 is provided in the width dimension of the diffused resistor along the line C-C" in FIG. 11 in the present embodiment. When the impurity concentration is constant, the resistivity of the n-type resistor is reduced within the range of Lc as shown in FIG. 1 of the first embodiment.

Therefore, when the resistivity of the resistor in this region is kept high in case no stress is acting, it becomes possible to finally obtain a predetermined resistivity (value) when reduction of the resistivity attendant upon generation of the stress is generated. In order to set the resistivity (value) of the resistor high, it is sufficient to make the width dimension of the rectangular resistor small. When it is assumed that the length of the rectangular resistor is L and the width thereof is W, and a sheet resistivity of the resistor determined by the impurity concentration profile (such as impurity concentration and depth of diffusion) is defined as $\rho\square$, the resistance value of that resistor is determined approximately by:

$$R = \rho\square (L/W) \tag{8}$$

Accordingly, in order to increase the resistance value of the resistor while maintaining the impurity concentration profile, it is sufficient either to make the length L longer or to narrow the width W. So, in the present embodiment, the length L is kept constant, and the width dimension W is changed with such distribution as shown in FIG. 12. The resistance value distribution when no stress is generated shows the distribution as shown in FIG. 12 by providing such resistor width distribution. Therefore, when the stress is generated practically, the resistivity variation distribution of the diffused resistor along the line C-C" in FIG. 11 is obtained as shown in FIG. 13.

Thus, it is also possible in the embodiment to control the resistivity variation quantity of the resistor formed in the stress distribution generating region in the vicinity of the boundary between the oxide film for isolation and the semiconductor element forming region at 1% or lower easily. In the present embodiment, the oxide film for isolation may be formed by a thermal oxidation process of a silicon substrate or may also be formed using a thin film deposition method as described in the first embodiment. Further, the diffused resistor is not necessarily to be an n-type resistor, but may be a p-type resistor.

However, since the direction of the resistivity variation originated in the stress is increased sometimes or decreased sometimes due to the sign of the piezoresistance coefficient, it is required to redesign the resistance value width dimension shown in FIG. 12 in accordance with respective cases. When it is desired to reduce the resistivity for instance, the resistor width has to be widened reversely to the present embodiment.

Further, a method of varying the length dimension L of the resistor may be adopted as the control method of the resistance value. This is because of such a reason that, when practical production is considered, the control quantity of the resistance value is the order of 1% or below in many cases and the length dimension is larger than the width dimension by approximately one place or more in many cases, thus making it easier to control the length direction for performing length adjustment by 1%.

Furthermore, the dimensions in both the length direction and the width direction may be changed (provided with distribution) if possible. Besides, a case of making the resistance value constant has been described in the present embodiment, but it is a matter of course that the design may be made so as to provide predetermined distribution in the final resistivity (value) distribution.

As described, it becomes possible in the present embodiment to control the resistivity variation quantity of the diffused resistor formed in the semiconductor element forming region at a predetermined value (e.g., 1%) or lower.

Figure 14:
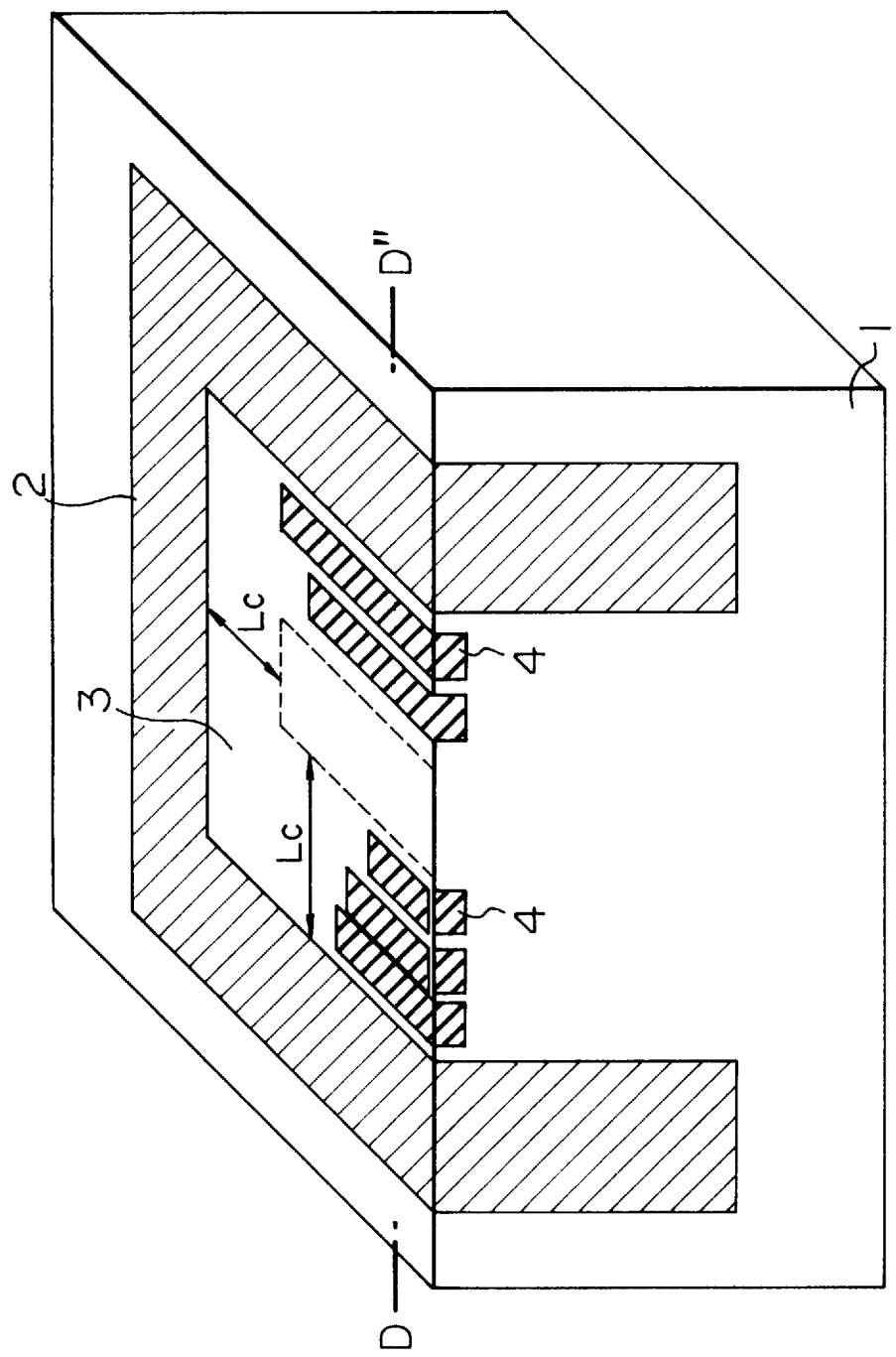
FIG. 14 is an explanatory view for explaining a high impurity concentration structure of a semiconductor device according to an embodiment of the present invention.
Figure 15:
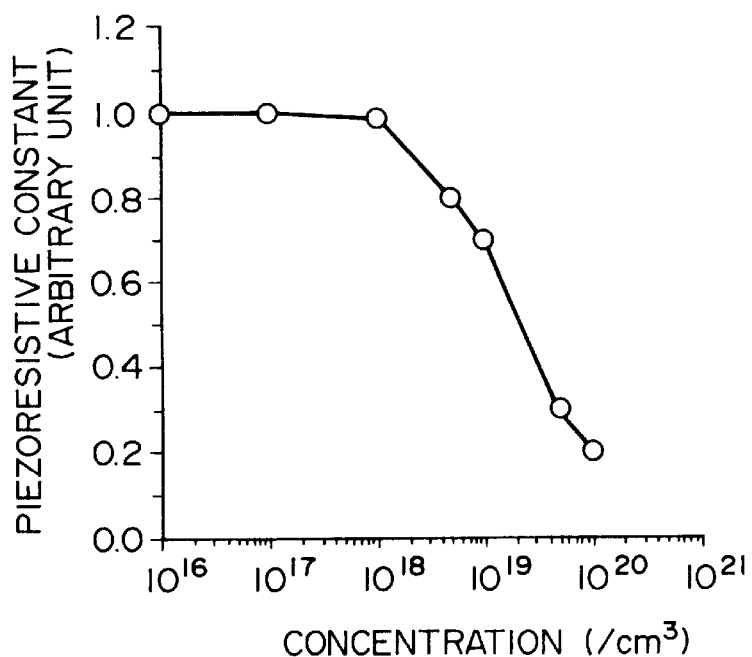
FIG. 15 is an explanatory diagram for explaining an example of impurity concentration dependency of a piezoresistance coefficient of a semiconductor device according to an embodiment of the present invention.
Figure 16:
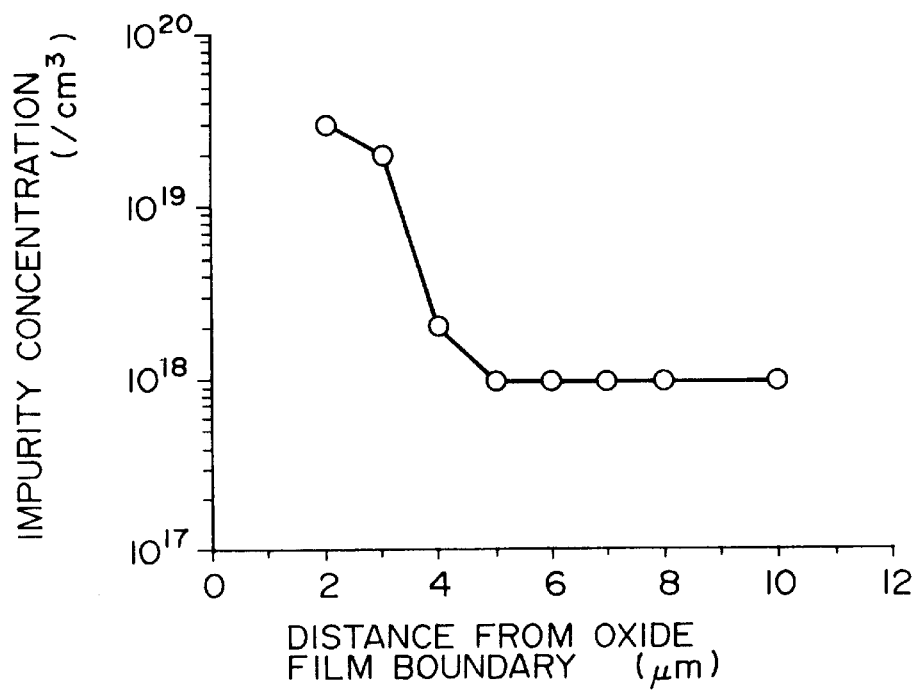
FIG. 16 is an explanatory diagram for explaining an impurity concentration profile (high concentration) of a semiconductor device according to an embodiment of the present invention.

Next, the fourth embodiment of the present invention will be described with reference to FIG. 14, FIG. 15, FIG. 16, FIG. 17 and FIG. 18. FIG. 14 shows a three-dimensional structural view of a semiconductor device that is an embodiment of the present invention, FIG. 15 shows an example of the measurement of the impurity concentration dependency of the piezoresistance coefficient, FIG. 16 shows an impurity concentration distribution diagram along a line D-D" in FIG. 13, FIG. 17 shows a resistivity variation distribution prediction result diagram along the line D-D" and FIG. 18 shows a resistivity variation distribution analysis result diagram along the line D-D" after application of the present invention.

Since it goes against high integration of a semiconductor device to provide Lc shown in the first embodiment, the present embodiment is featured by a structure that diffused resistors are also formed in the range of Lc from a viewpoint of effective utilization of the region. However, since the resistivity variation quantity of the resistors becomes larger only when the diffused resistors are formed simply as described in the first embodiment, the present embodiment is featured in that the resistivity variation quantity of the diffused resistors formed in the region is designed so as to show a predetermined value or below by making the impurity concentration of the diffused resistors formed in the range of Lc higher thereby to make the piezoresistance coefficient smaller.

As described previously, there is the impurity concentration dependency in the piezoresistance coefficient. FIG. 15 shows an example of measuring the impurity concentration dependency. When the concentration of impurities introduced into the diffused resistors is $10^{18}/cm^3$ or lower, the coefficient scarcely changes, but the coefficient value is reduced monotonously when the concentration exceeds $10^{18}/cm^3$. Thus, when the impurity concentration of the diffused resistors formed in the region where stress gradient is generated is made higher, it becomes possible to lower the regulation of the resistivity (value) even if the generated stress value is constant.

Figure 17:
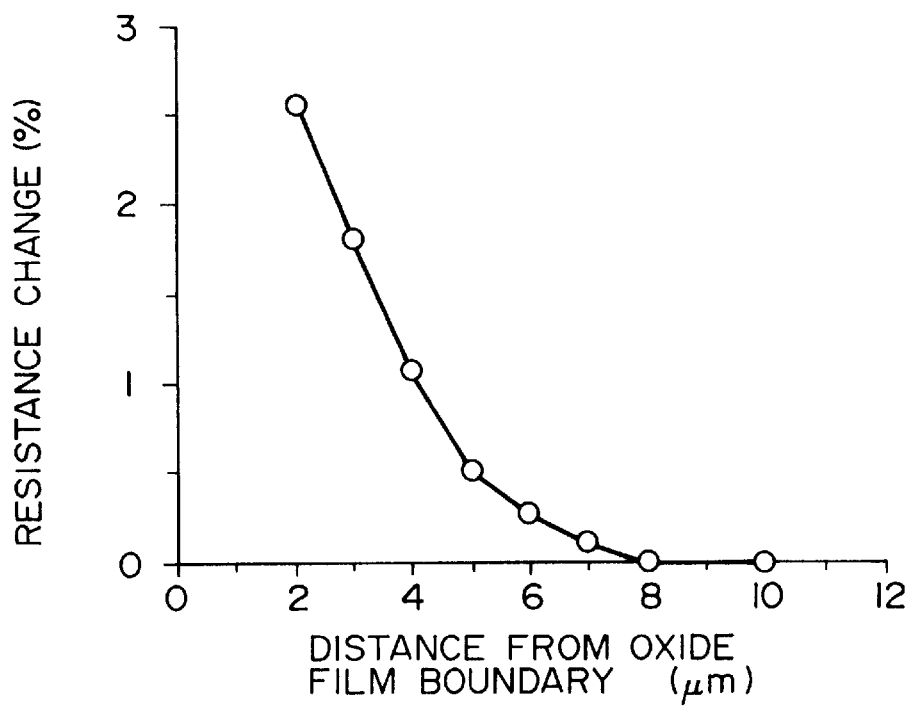
FIG. 17 is a resistance value change distribution prediction diagram of a semiconductor device according to an embodiment of the present invention.
Figure 18:
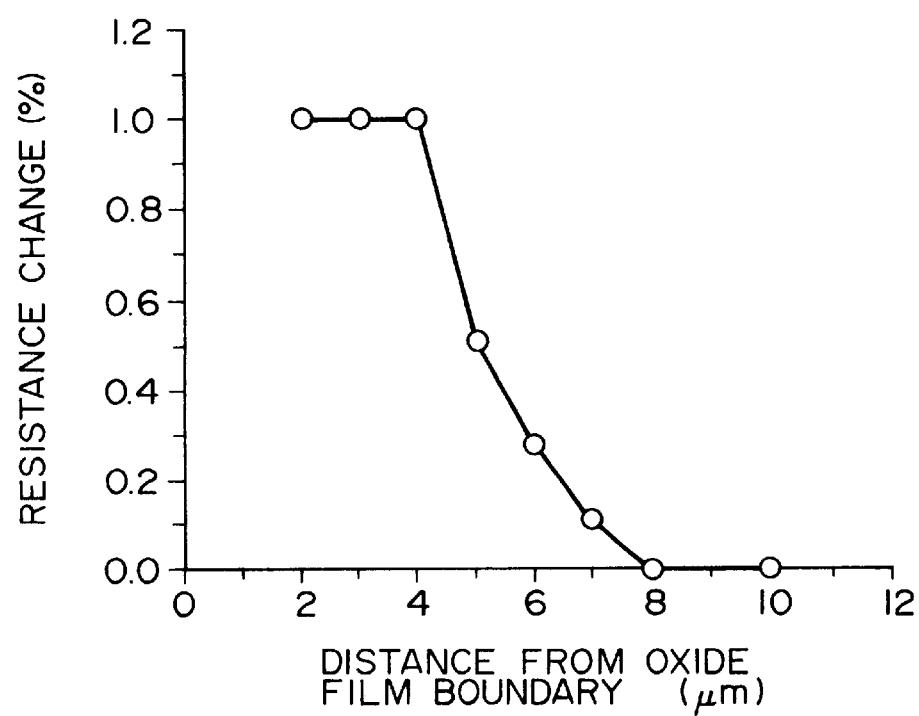
FIG. 18 is a final resistance value change distribution prediction diagram of a semiconductor device according to an embodiment of the present invention.

Thus, when the diffused resistor is formed with a p-type resistor, and the variation of the resistivity can be approximated with $\Delta R/R \sim \pi_{11} \cdot \sigma_x$ and the impurity concentration is constant, a structure in that the impurity concentration is controlled so as to lower the piezoresistance coefficient is designed so that the variation quantity of the resistance value shows a predetermined value or lower taking the predicted resistivity variation distribution as shown in FIG. 17 into consideration.

When the impurity concentration is set high so that the piezoresistance coefficient becomes ½ or lower, it becomes possible as the result to make the resistivity variation quantity to 1% or lower at a location where the resistivity variation is predicted to be 2% for instance. An example of the result that the impurity concentration is determined so that the resistivity variation distribution shown in FIG. 2 of the first embodiment shows a predetermined value (e.g., 1%) over the whole inside of the semiconductor element forming region while paying attention only to the impurity concentration dependency of the piezoresistance coefficient from such a point of view is shown in FIG. 16.

Since such distribution that the impurity concentration becomes higher toward the side of the boundary between the oxide film for isolation and the semiconductor element forming region, when a resistor having a constant resistance value is formed for instance, the design is made so that the resistor becomes long and slender in configuration (the value of L/W shown in the third embodiment is made larger) toward the boundary as shown in FIG. 14. When it is desired to obtain a predetermined distribution of the resistance values, it is sufficient to design the resistor configuration taking the impurity concentration distribution into consideration.

The result of resistivity variation prediction analysis of the resistors in that the impurity concentration distribution is designed as shown in FIG. 16 is shown in FIG. 18. By designing the impurity concentration distribution of the diffused resistors taking the generated stress distribution and the impurity concentration dependency of the piezoresistance coefficient into consideration as shown in FIG. 18, it becomes possible to control the resistivity (value) variation quantity of the resistors formed in the stress distribution (gradient) generating region in the vicinity of the boundary between the oxide film for isolation and the semiconductor forming region at a predetermined value (e.g., 1%) or lower.

Figure 19:
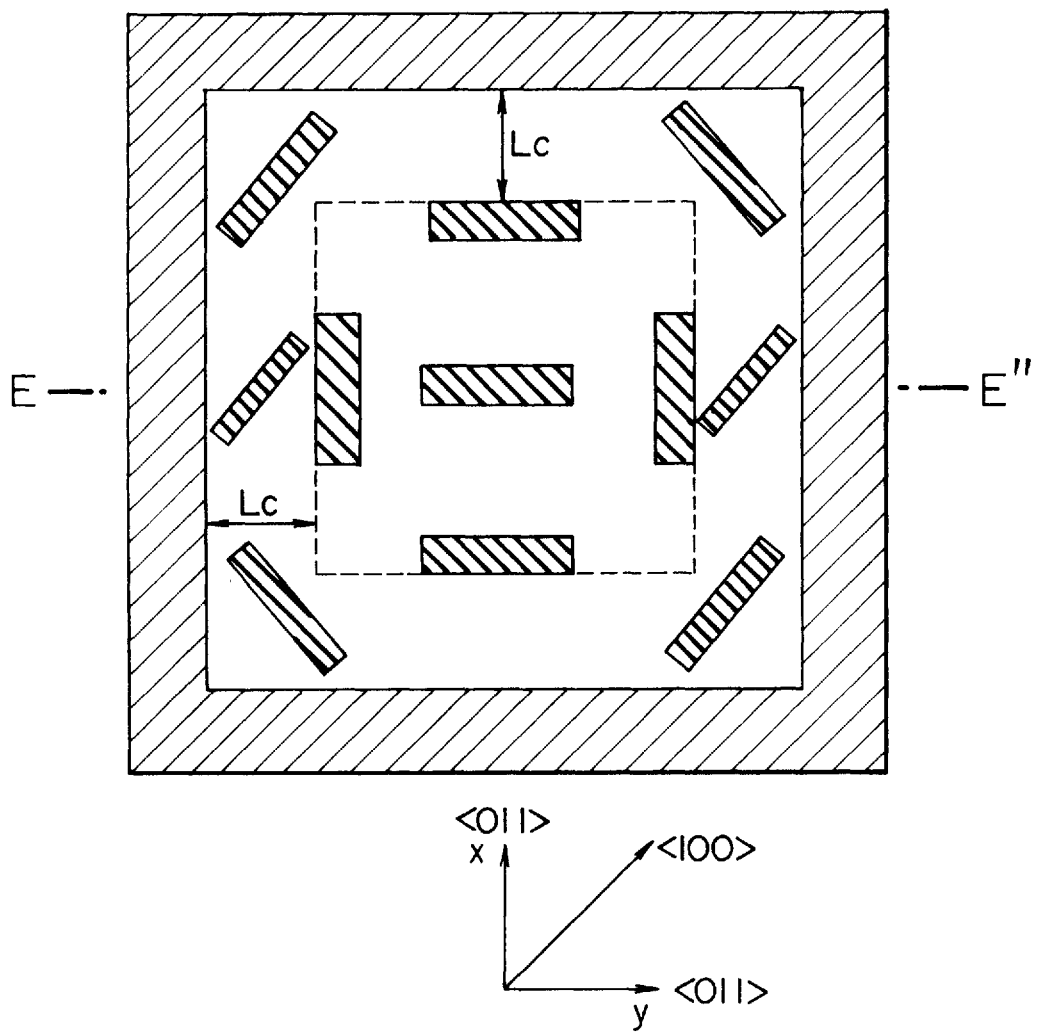
FIG. 19 is an explanatory view of a resistor orientation structural diagram of a semiconductor device according to an embodiment of the present invention.
Figure 20:
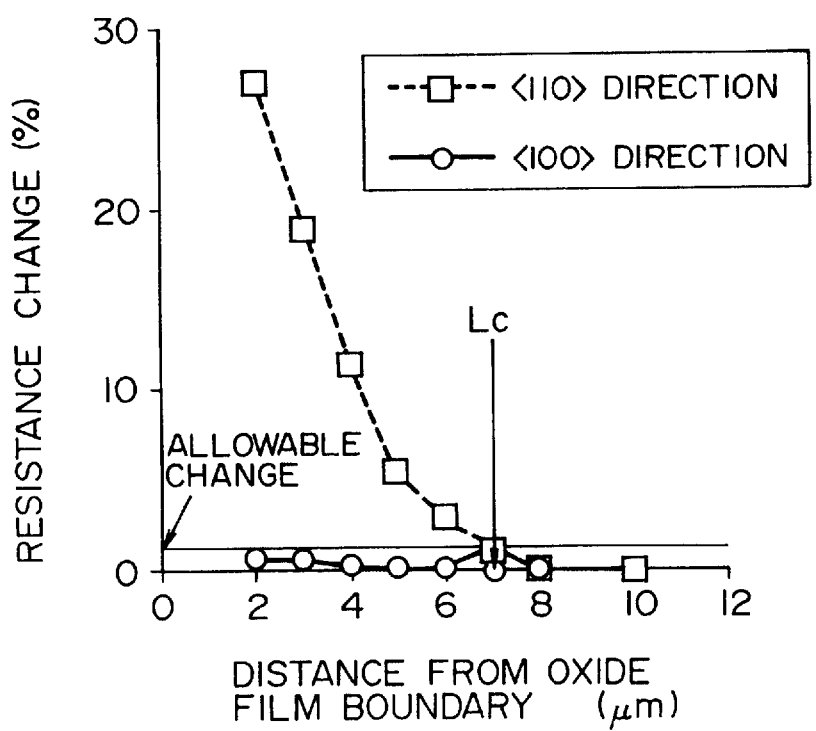
FIG. 20 is a resistivity change distribution diagram of FIG. 16.

Next, the fifth embodiment of the present invention will be described with reference to FIG. 19 and FIG. 20. FIG. 19 is a three-dimensional structural view of a semiconductor device that is an embodiment of the present invention, and FIG. 20 is a resistivity variation distribution prediction diagram of resistors along a line E-E" in FIG. 19.

Since it goes against high integration of a semiconductor device to provide Lc shown in the first embodiment, the present embodiment is featured by a structure that diffused resistors are also formed in the range of Lc from a viewpoint of effective utilization of the region. However, since the resistivity variation quantity of the resistors becomes larger when only the diffused resistors are formed simply as described in the first embodiment, the present embodiment is featured in that the longitudinal direction of the rectangular resistor formed in the range of Lc shown in the first embodiment in the semiconductor element forming region is arranged so as to be parallel to the <100> crystallographic direction of the silicon substrate.

The orientation of the resistor formed at a location farther than Lc is optional, but it is assumed that the resistor is formed parallel to the <110> crystallographic direction. Considering a case that the resistor is formed in the n-type, when the piezoresistance coefficient shown in Table 1 is used, as described in the paragraph of operation, the resistivity variation quantity of the resistor formed parallel to the <110> crystallographic direction is expressed as:

$$\Delta R/R = 64.2\sigma_x - 60.8\sigma_y - 2.3\sigma_z$$

and the resistivity variation quantity of the resistor formed parallel to the <100> crystallographic direction is expressed as:

$$\Delta R/R = 1.7\sigma_x + 1.7\sigma_y - 2.3\sigma_z + 8.0\tau_{xy}$$

When it is assumed that the distance from the diffused resistor to the oxide film for isolation in the x-direction shown in FIG. 19 is sufficiently larger than Lc shown in the first embodiment and the values $\sigma_z$ and $\tau_{xy}$ are sufficiently smaller than $\sigma_y$, the result of resistivity variation prediction analysis of the resistor along a line E-E" in FIG. 19 when the stress field shown in FIG. 1 of the first embodiment acts in the y-direction is shown in FIG. 20.

As it is apparent from FIG. 20, it becomes possible to control the resistivity (value) variation quantity of the resistor formed in the element forming region to a predetermined value (e.g., 1%) or lower even when the stress distribution is generated in the semiconductor element forming region by forming a resistor arrangement structure according to the present invention.

Figure 21:
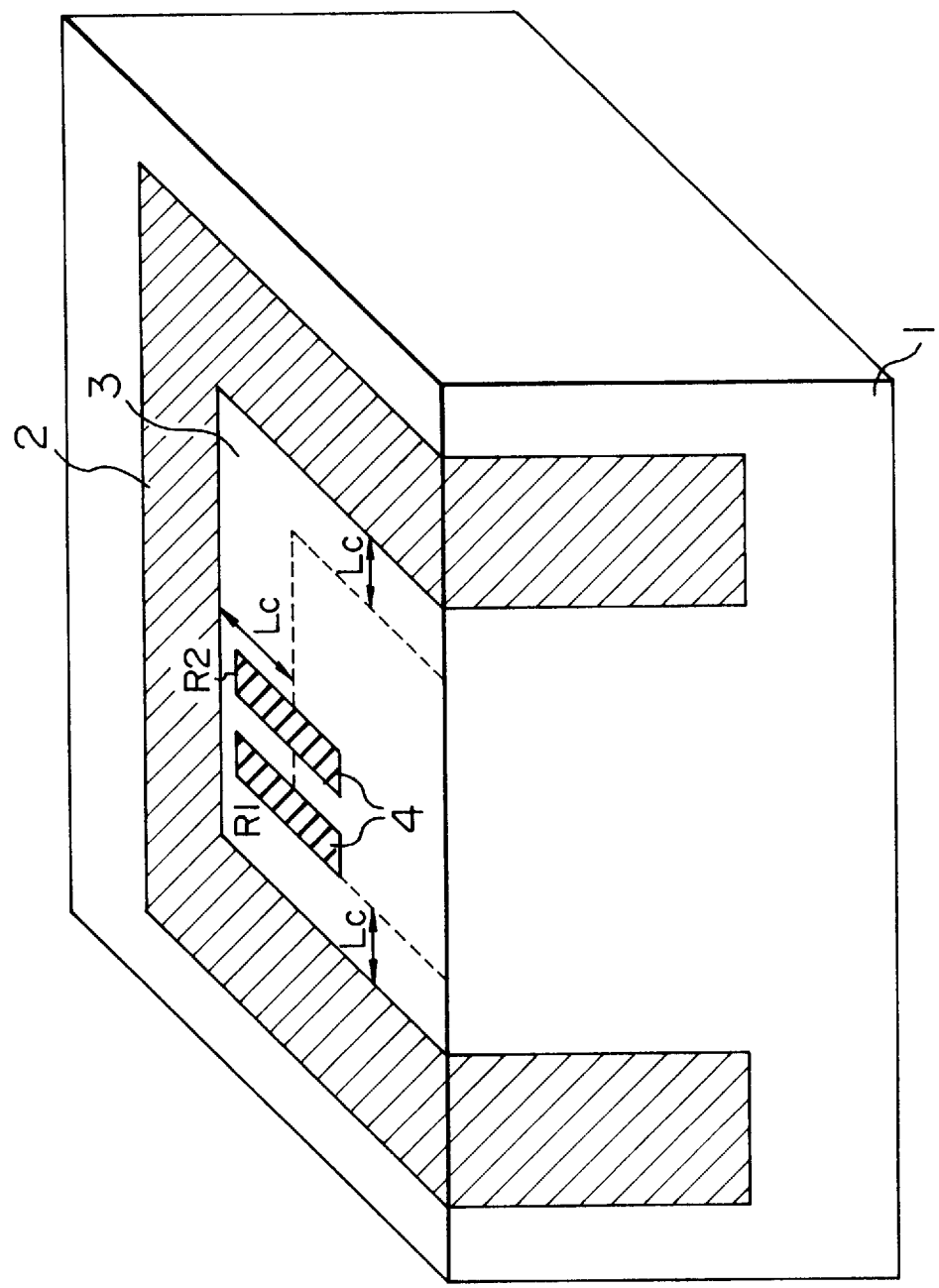
FIG. 21 is an explanatory view for explaining a semiconductor device structural plan (longitudinal arrangement) of a semiconductor device according to an embodiment of the present invention.

Next, the sixth embodiment of the present invention will be described with reference to FIG. 21 and FIG. 22. FIG. 21 is a three-dimensional structural view of a semiconductor device that is an embodiment of the present invention. In FIG. 21, the diffused resistors provided in the semiconductor element forming region correspond to the resistors R1 and R2 used in the amplifier circuit shown in FIG. 5 or the resistors R1 to R4 used in the differential amplifier circuit shown in FIG. 22.

Since it goes against high integration of a semiconductor device to provide Lc shown in the first embodiment, the present embodiment is featured by a structure that the diffused resistors are also formed in the range of Lc from a viewpoint of effective utilization of the region. However, what is different from the embodiments described so far is a fact that the longitudinal direction of the resistor formed in a rectangular shape is arranged parallel to the direction meeting at right angles with the boundary between the oxide film for isolation and the semiconductor element forming region.

In the present embodiment, the resistance values of the diffused resistors are varied in accordance with the stress distribution generated in the vicinity of the boundary.

However, R1 and R2 or R3 and R4 are used in the amplifier circuit shown in FIG. 5, and the output voltage of the amplifier circuit is determined by the ratio of R1 to R2 or R3 to R4 as described in the paragraph of operation. Therefore, no influence is exerted upon the circuit operation even when the resistivities (values) of R1 and R2 or R3 and R4 are changed at a uniform ratio. Thus, the diffused resistor in which no influence is exerted upon the circuit operation even if the resistivity (value) is changed may be arranged in the region where the stress distribution is formed.

Figure 22:
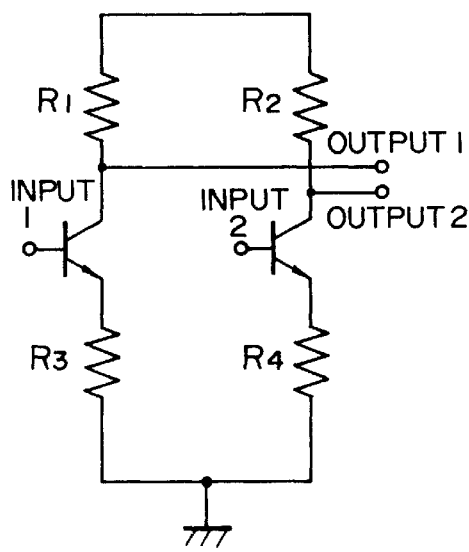
FIGS. 22 to 25 are explanatory diagrams for explaining exemplary circuits of semiconductor devices according to an embodiment of the present invention.

When the resistors R1 to R4 of the differential amplifier circuit shown in FIG. 22 are arranged in a structure similar to that shown in FIG. 21, the resistance value changes, but no influence is exerted upon the characteristics as the differential amplifier circuit.

Figure 23:
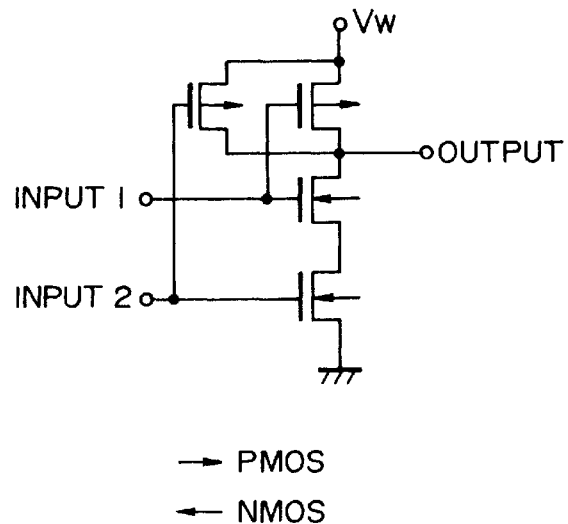
Figure 24:
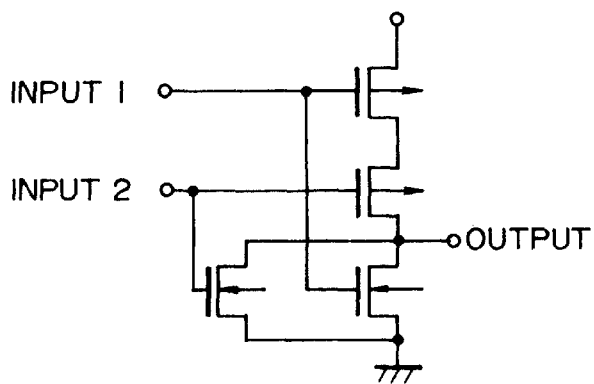
Figure 25:
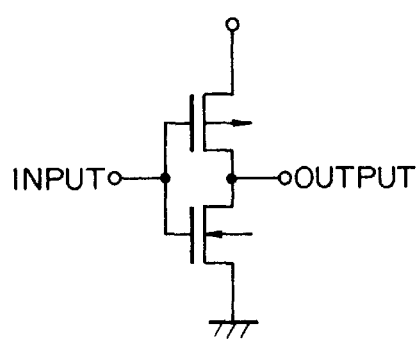

It is possible to apply the control of variation originated in the stress according to the present invention to the resistors in a CMOS circuit, an NMOS circuit and a PMOS circuit shown in FIG. 23 to FIG. 25 in lieu of a bipolar circuit shown in FIG. 22. Besides, the present invention is also applicable to a resistor arrangement forming an AD converter and a DA converter for which accuracy of resistance values of resistors is required.

Thus, it is possible to control the characteristic variation of the semiconductor element circuit at a predetermined value (e.g., 1%) or below.

There is such an effect that, in a semiconductor device having adjacent oxide film for isolation and semiconductor element forming region, it is possible to control the characteristic variation of a semiconductor element or circuit produced due to a stress generated in the vicinity of the regional boundary very small (e.g., 1% or below) independently of the location of the semiconductor device where the semiconductor element or circuit is formed.

We claim:

1. A semiconductor device comprising:
   a film for isolation;
   a region surrounded by said isolation film for forming an element therein; and
   circuitry having a diffused resistor layer with a resistance value variation of one percent or less, said diffused resistance layer being located apart from said isolation film by a space four times or more the thickness of said isolation film from a substrate surface.

2. A semiconductor device according to claim 1, further comprising other diffused resistor layers formed apart from said isolation film by a space less than four times the thickness of said isolation film, wherein a portion of said other diffused resistor layers located between a closest isolation film and said space has impurity concentration different from that of remaining portion of said other diffused resistor layers to provide a resistance value variation of one percent or less for said other diffused resistor layers.

3. A semiconductor device according to claim 2, wherein a pair of said other diffused resistor layers are connected to any one of a differential amplifier circuit, an operational amplifier circuit, analog-to-digital conversion circuit and a digital-to-analog conversion circuit.

4. A semiconductor device according to claim 2, wherein said other diffused resistor layers are connected to a collector or an emitter, or a base of a bipolar transistor.

5. A semiconductor device according to claim 2, wherein said other diffused resistor layers are connected to a digital logic circuit.

6. A semiconductor device according to claim 1, further comprising other diffused resistor layers formed apart from said isolation film by a space less than four times the thickness of said isolation film with the longitudinal direction thereof arranged approximately at right angles with said isolation film, wherein a portion of said other diffused resistor layers located between a closest isolation film and said space has impurity concentration different from that of remaining portion of said other diffused resistor layers to provide a resistance value variation of one percent or less for said other diffused layers.

7. A semiconductor device according to claim 1, further comprising:
   a first circuit having a linear circuit connected to said plurality of diffused resistor layers; and
   another diffused resistor layer having a resistance value more rough in point of accuracy than the resistance value of said plurality of diffused resistor layers connected to said first circuit.

8. A semiconductor device according to claim 1, further comprising:
   a first circuit of the circuit connected to said plurality of diffused resistor layers;
   another diffused resistor layer having a resistance value more rough in point of accuracy than the resistance value of said diffused resistor layer connected to said first circuit; and
   a second circuit of the circuit connected to said another diffused layer, said second circuit having a circuit structure corresponding to said more rough resistance value than said first circuit.

9. A semiconductor device comprising:
   a thermal oxide film for isolation;
   a semiconductor region that becomes an element forming region with the circumference thereof surrounded by said thermal oxide film for isolation; and
   circuitry having at least one diffused resistor layer located to have a distance between said at least one diffused resistor layer and the end of said thermal oxide film for isolation so that said diffused resistor layer will have a resistance value variation of one percent or less.

10. A semiconductor device according to claim 9, wherein said distance is four times of the thickness from the semiconductor surface of said thermal oxide film for isolation.

11. A semiconductor device according to claim 9, further comprising another diffused resistor layer having a portion in a stress distribution (gradient) forming region wherein a longitudinal direction of the diffused resistor layer portion existing in said stress distribution forming region is parallel to the stress gradient.

12. A semiconductor device according to claim 11, wherein resistance value distribution is formed parallel to the stress gradient in said diffused resistor layer portion formed in said stress distribution (gradient) forming region inside said another diffused resistor layer.

13. A semiconductor device according to claim 9, wherein said at least one diffused resistor layer is a rectangular diffused resistance layer.

14. A semiconductor device according to claim 9, wherein the thickness of said thermal oxide film for isolation is 1 μm or more.

15. A semiconductor device according to claim 12, wherein, in the resistance value distribution of said diffused resistor layer portion, the resistance value rises gradually toward the boundary between said thermal oxide film for isolation and said semiconductor region when n-type is diffused in said diffused layer, and the resistance value falls gradually toward the boundary between said thermal oxide film for isolation and said semiconductor region when p-type impurity is diffused in said diffused layer.

16. A semiconductor device according to claim 12, wherein means for providing said resistance value distribution uses at least one of impurity concentration change and configuration change.

17. A semiconductor device according to claim 11, wherein said another diffused resistor layer forms at least a part of resistors or transistors used in any of a differential amplifier circuit, an operational amplifier circuit and an analog to digital and or digital to analog conversion circuit.

18. A semiconductor device according to claim 11, wherein said another diffused resistor layer is used in a collector region and an emitter region connected to a collector or an emitter, or a base of a bipolar transistor.

19. A semiconductor device according to claim 9, wherein a distance between the end portion closest to said thermal oxide film for isolation of said each diffused layer and the end of said thermal oxide film for isolation is apart by at least 4 μm or more.

20. A method of designing a semiconductor device having a thermal oxide film for isolation and a semiconductor region that becomes an element forming region with the circumference thereof surrounded by said thermal oxide film for isolation, in which diffused resistance layers are formed in said semiconductor region, comprising the steps of:
determining a distance between an end portion closest to said thermal oxide film for isolation of said diffused resistance layer and an end of said thermal oxide film for isolation from stress distribution in the semiconductor region, a piezoresistance coefficient of the diffused resistance layer and an allowable value of resistivity variation of the diffused layer; and
preparing a plurality of masks for ion implantation use for ion implantation for forming said resistance layers, in which mask ends are changed so as to provide approximately said resistivity variation in the longitudinal direction of said resistance layer.

21. A semiconductor device according to claim 7, further comprising:
a second circuit of said circuit connected to said another diffused layer and having a digital logic circuit.

22. A semiconductor device comprising:
a film for isolation;
a region surrounded by said isolation film for forming an element therein; and
a plurality of diffused resistor layers formed by diffusion of impurities for a circuit in said element forming region, each of said diffused resistor layers having a resistance value variation of one percent or less and located apart from said isolation film by a space four times or more the thickness of said isolation film.

23. A semiconductor device comprising:
a film for isolation;
a region surrounded by said isolation film for forming an element therein; and
a plurality of diffused resistor layers formed by diffusion of impurities for a circuit in said element forming region, wherein a change in resistivity for each of the diffused resistor layers due to mechanical stress caused by said isolation film is one percent or less, and wherein each of said diffused resistor layers is located apart from said isolation film by a space four times or more the thickness of said isolation film.

24. A semiconductor device comprising:
a film for isolation;
a region surrounded by said isolation film for forming an element therein; and
a plurality of diffused resistor layers formed by diffusion of impurities for a circuit in said element forming region, wherein change in resistivity for each of the diffused resistor layers is 1% or less, and wherein at least one of the diffused resistor layers is formed in an area where residual stress caused by said isolation film is less than 50 MPa.

25. A semiconductor device comprising:
a film for isolation;
a region surrounded by said isolation film for forming an element therein;
a plurality of diffused layers formed by diffusion of impurities for a circuit in said element forming region; and
circuitry having a diffused resistor formed apart from said isolation film by a space less than four times the thickness of said isolation film, wherein a portion of said diffused resistor layer located between a closest isolation film and said space has impurity concentration different from that of remaining portion of said diffused resistor layer to provide a resistance value variation of one percent or less for said diffused resistor layer.

26. A semiconductor device comprising:
a film for isolation;
a region surrounded by said isolation film for forming an element therein;
a plurality of diffused layers formed by diffusion of impurities for a circuit in said element forming region; and
circuitry having a diffused resistor formed apart from said isolation film by a space less than four times the thickness of said isolation film, wherein said diffused resistor layer is configured to provide a resistance value variation of one percent or less for said diffused resistor layer.

* * * * *